(12) United States Patent
Taniguchi

(10) Patent No.: US 7,227,679 B2
(45) Date of Patent: Jun. 5, 2007

(54) LIGHT IRRADIATION APPARATUS, LIGHT IRRADIATION METHOD, CRYSTALLIZATION APPARATUS, CRYSTALLIZATION METHOD, DEVICE, AND LIGHT MODULATION ELEMENT

(75) Inventor: Yukio Taniguchi, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 111 days.

(21) Appl. No.: 11/051,189

(22) Filed: Feb. 7, 2005

(65) Prior Publication Data

US 2005/0179885 A1 Aug. 18, 2005

(30) Foreign Application Priority Data

Feb. 17, 2004 (JP) ............................. 2004-039747

(51) Int. Cl.
*G02F 1/01* (2006.01)
*G02B 26/00* (2006.01)
(52) U.S. Cl. ...................................... 359/279; 359/238
(58) Field of Classification Search ................ 359/238, 359/279
See application file for complete search history.

(56) References Cited

OTHER PUBLICATIONS

Masakiyo Matsumura, "Preparation of Ultra-Large Grain Silicon Thin-Films by Excimer-Laser", Journal of the Surface Science Society of Japan, vol. 21, No. 5, 2000, pp. 278-287.
H. Ogawa, et al., "Growth of Large Si Grains at Room Temperature by Phase-Modulated Excimer-Laser Annealing Method", IDW'03 Proceedings of the 10th International Display Workshops, pp. 323-326.

*Primary Examiner*—David Spector
*Assistant Examiner*—Jack Dinh
(74) *Attorney, Agent, or Firm*—Oblon, Spivak, McClelland, Maier & Neustadt, P.C.

(57) ABSTRACT

A light irradiation apparatus includes a light modulation element which modulates a phase of an incident light beam to obtain a V-shaped light intensity distribution having a bottom portion of a minimum light intensity, and an image formation optical system which applies the modulated light beam from the light modulation element to an irradiation target surface in such a manner that the V-shaped light intensity distribution is provided on the irradiation target surface. The light modulation element has such a complex amplitude transmittance distribution that a secondary derivative of a phase value of a complex amplitude distribution becomes substantially zero at the bottom portion of the V-shaped light intensity distribution in an image space of the image formation optical system.

10 Claims, 15 Drawing Sheets

LIGHT IRRADIATION APPARATUS, LIGHT IRRADIATION METHOD, CRYSTALLIZATION APPARATUS, CRYSTALLIZATION METHOD, DEVICE, AND LIGHT MODULATION ELEMENT

CROSS-REFERENCE TO RELATED APPLICATIONS

This application is based upon and claims the benefit of priority from prior Japanese Patent Application No. 2004-039747, filed Feb. 17, 2004, the entire contents of which are incorporated herein by reference.

BACKGROUND OF THE INVENTION

1. Field of the Invention

The present invention relates to a light irradiation apparatus, a light irradiation method, a crystallization apparatus, a crystallization method, a device, and a light modulation element.

2. Description of the Related Art

A thin film transistor (TFT) which is used for a switching element or the like which selects a display pixel in, e.g., a liquid crystal display (LCD) has been conventionally formed in an amorphous silicon layer or a polysilicon layer.

The polysilicon layer has a higher mobility of electrons or holes than the amorphous silicon layer. Therefore, when a transistor is formed in a polysilicon layer, a switching speed is increased and a display response speed is thus increased as compared with a case where a transistor is formed in an amorphous silicon layer. Further, a peripheral LSI can be thereby formed of a thin film transistor. Furthermore, there is an advantage that a design margin of any other component can be reduced. Moreover, peripheral circuits such as a driver circuit or a DAC can be operated at a higher speed when these peripheral circuits are incorporated in a display.

Since polysilicon is formed of an aggregation of crystal grains, when, e.g., a TFT transistor is formed, a crystal grain boundary or boundaries exist in a channel area of such a transistor, and the crystal grain boundaries become an obstacle and lower the mobility of electrons or holes as compared with single-crystal silicon. Additionally, in case of many thin film transistors formed to polysilicon, the number of crystal grain boundaries formed in channel portions differs between the respective thin film transistors, and this becomes unevenness in transistor characteristics and leads to a problem of display irregularities in case of a liquid crystal display. Thus, in recent years, in order to improve the mobility of electrons and holes and reduce irregularities in the number of crystal grain boundaries in channel portions, there has been proposed a crystallization method which generates crystallized silicon having crystal grains with a particle size which is as large as one channel area can be formed in each crystal grain.

As this type of crystallization method, there has been conventionally known a "phase control ELA (Excimer Laser Annealing) method" which generates a crystallized semiconductor film by irradiating, with an excimer laser light, a phase shifter which is closely arranged in parallel to a non-single-crystal semiconductor film such as a polysilicon semiconductor film or an amorphous semiconductor film. The detail of the phase control ELA method is described in, e.g., Journal of the Surface Science Society of Japan Vol. 21, No. 5, pp. 278–287, 2000.

In the phase control ELA method, a light intensity distribution having an inverse peak pattern (a pattern in which a light intensity is minimum at the center (a minimum light intensity portion) and the light intensity is suddenly increased toward the periphery or in the lateral direction) in which the light intensity is lower than that at the periphery is generated at a point or a line corresponding to a phase shift portion of a phase shifter, and a non-single-crystal semiconductor film is irradiated with a light having this inverse-peak-shaped light intensity distribution so that the non-single-crystal semiconductor film is fused. As a result, a temperature gradient is generated in a fusing area according to the light intensity distribution in an irradiation target area, a crystal nucleus is formed at a part which is solidified first or not solidified in accordance with the minimum intensity portion, and a crystal grows in a lateral direction from this crystal nucleus toward the periphery (which will be referred to as a "lateral growth" or a "growth in a lateral direction" hereinafter), thereby generating a crystal grain with a large particle size.

Further, "Growth of Large Si Grains at Room Temperature by Phase-Modulated Excimer-Laser Annealing Method" by H. Ogawa et al., IDW '03 Proceedings of The 10th International Display Workshops, p. 323 brings forth a crystallization method which generates a crystal grain by irradiating a non-single-crystal semiconductor film with a light having a V-shaped light intensity distribution obtained through a phase shifter and an image formation optical system. This reference discloses that it is desirable for an intensity distribution of a light which irradiates the non-single-crystal semiconductor film to vary in a V shape in a range of 0.5 to 1.0 when its maximum value is standardized as 1.0. The "light intensity distribution with the inverse peak pattern" and the "V-shaped light intensity distribution" have the same function as seen from each central portion (the minimum light intensity distribution and the vicinity thereof). The both light intensity distribution are written as a "V-shaped light intensity distribution" in the present invention.

The inventors of the present application proposes a light modulation element which can obtain a V-shaped light intensity distribution by a combination with an image formation optical system in, e.g., Jpn. Pat. Appln. No. 2003-117486 (which will be referred to as a "related application" hereinafter). The light modulation element proposed in the related application is a "binary modulation type" phase shifter having a reference phase value of 0 degree and a modulation phase value of 90 degrees, i.e., two types of modulation phase values, which has a phase modulation whose dimension is not greater than a point spread function range of an image formation optical system when converted into a counterpart on a light modulation element. Incidentally, it is needless to say that disclosed matters in the related application do no constitute a prior art of the present application.

Specifically, as shown in FIG. 14, a typical light modulation element proposed in the related application has a reference phase area (indicated by a blank portion in the figure) 10a having a reference phase value of 0 degree and rectangular phase-modulation areas (indicated by shaded portions in the figure) 10b having a modulation phase value of 90 degrees. An occupied area ratio (a duty) of the phase-modulation areas 10b to the reference phase area 10a linearly varies between 0% and 50% along a horizontal direction (a lateral direction) (along an X cross section) in the figure. Concretely, an occupied area ratio of the phase-modulation areas 10b is 0% on both sides of a phase pattern along the horizontal direction, and an occupied area ratio of the phase-modulation areas is 50% at the center.

When such a light modulation element and an image formation optical system which forms an image of a light modulated by this light modulation element on a non-single-crystal semiconductor film are used, such a V-shaped light intensity distribution as shown in FIGS. 15A to 15C are obtained on the non-single-crystal semiconductor film. The light intensity distributions shown in these figures are calculated on the assumption that a wavelength λ of an incident light beam is 248 nm, an image side numerical aperture NA of the image formation optical system is 0.13 and a value σ (a coherence factor) of the image formation optical system is 0.47. A light intensity I obtained at a focus position or plane of the image formation optical system is dependent on an occupied area ratio D (which varies between 0 and 0.5 in the example shown in FIG. 14) of the phase-modulation areas 10b at a position in question along the X cross section, and approximately represented by the following expression.

$$I \approx (4-4\underline{A})|D-0.5|^2 + \underline{A}$$

where $\underline{A} \approx \cos^2(\theta/2)$

In this expression, θ is a modulation phase value (90 degrees in the example shown in FIG. 14), and $\underline{A}$ is a standardized value of a light intensity obtained at a focus surface position corresponding to a position where an occupied area ratio D is 50% on the maximum level (a value when a maximum value of a light intensity in a V-shaped light intensity distribution is standardized as 1.0).

When the light modulation element shown in FIG. 14 is used, a substantially ideal V-shaped light intensity distribution which is substantially symmetrical in a lateral direction with a minimum intensity portion at the center and whose formation position is controlled is formed at a focus position (an image formation surface) of the image formation optical system as shown in FIG. 15B. However, not only a shape of the V-shaped light intensity distribution to be formed changes but is asymmetrically varies depending on a defocusing direction at a position slightly moved from the focus position by 10 μm in a direction closer to the image formation optical system as shown in FIG. 15A (a defocus position of −10 μm) or at a position slightly moved from the focus position by 10 μm in a direction apart from the image formation optical system as shown in FIG. 15C (a defocus position of +10 μm).

A board thickness deviation which can be a factor of defocusing unavoidably exists in a glass sheet used as a processed substrate having a non-single-crystal semiconductor film formed thereon, which should be irradiated with a light. As a result, a shape of the V-shaped light intensity distribution asymmetrically changes due to defocusing, and a desired V-shaped light intensity distribution cannot be stably formed on a non-single-crystal semiconductor film. Therefore, there occurs an inconvenience that crystal grains cannot be generated in substantially equal sizes in a semiconductor film on the processed substrate. Specifically, when slightly moved from the focus position by −10 μm as shown in FIG. 15A, a light intensity distribution in which two minimum light intensity portions exist is formed, and hence a crystal growth start point is divided into two points, thereby reducing a size of the proper crystal grain. Furthermore, as shown in FIG. 15C, in a light intensity distribution formed at a position slightly moved from the focus position by +10 μm, it can be understood that an uncrystallized area expands and a "filling factor of crystal grains" is reduced. Here, "the filling factor of crystal grains" is a ratio of a crystallized area to a light irradiation area when a non-single-crystal semiconductor film is irradiated with a light beam having a V-shaped light intensity distribution.

In a binary modulation type light modulation element, when a modulation phase value is set to 180 degrees rather than 90 degrees mentioned above, a V-shaped light intensity distribution to be formed does not asymmetrically change in dependence on the defocusing direction. However, an attempt to assure the minimum light intensity portion to be large to some extent in the V-shaped light intensity distribution with a modulation phase value being set to 180 degrees restricts a distribution of an occupied area ratio of phase-modulation areas having the modulation phase value to 0% to around 100%. This means that a phase area having the modulation phase value or the reference phase value becomes extremely small, and also means that production of the binary modulation type light modulation element whose modulation phase value is 180 degrees is practically difficult.

BRIEF SUMMARY OF THE INVENTION

It is an object of the present invention to provide a crystallization apparatus and a crystallization method which can stably form a desired V-shaped light intensity distribution even if slightly moved from a focus position and can substantially evenly generate crystal grains on a semiconductor film.

According to a first aspect of the present invention, there is provided a light irradiation apparatus defined in claim 1.

It is preferable to satisfy the following conditions:

$$(\delta^2/\delta x^2) \arg(\int T(X,Y)dXdY) \approx 0$$

$$(\delta^2/\delta y^2) \arg(\int T(X,Y)dXdY) \approx 0$$

wherein (X,Y) is an in-plane coordinate of the light modulation element, T(X,Y) is a complex amplitude transmittance distribution of the light modulation element, (x,y) is an in-plane coordinate of an image surface of the image formation optical system, ∫ is an integration symbol in a point spread function range of the image formation optical system where a point on the light modulation element corresponding to the point (x,y) on the image surface is the center, and arg is a function which is required to obtain a phase value.

In the light irradiation apparatus, the complex amplitude transmittance distribution of the light modulation element preferably has a phase modulation unit whose size is not greater than a point spread function range of the image formation optical system. It is preferable that the light modulation element has at least three types of phase areas having fixed phase values different from each other and occupied area ratios of these areas vary in accordance with a predetermined pattern. In this case, it is preferable that the light modulation element comprises a reference phase area having a reference phase value of 0 degree as a reference, a first phase-modulation area having a first modulation phase value as a phase-modulation having a positive value, and a second phase-modulation area having a second modulation phase value as a phase modulation having a negative value which is substantially equal to an absolute value of the first modulation phase value as at least three types of phase areas mentioned above. In this case, it is preferable that a pattern with which an occupied area ratio of the first phase-modulation area to the reference phase area varies is substantially equal to a pattern with which an occupied area ratio of the second phase-modulation area to the reference phase area varies.

According to a second aspect of the present invention, there is provided a light irradiation method defined in claim 7.

According to a third aspect of the present invention, there is provided a crystallization apparatus comprising the light irradiation apparatus of the first aspect and a stage which holds a processed substrate having a non-single-crystal semiconductor film on an image formation surface of the image formation optical system.

According to a fourth aspect of the present invention, there is provided a crystallization method which applies a light having the V-shaped light intensity distribution to the processed substrate having a non-single-crystal semiconductor film set as the predetermined surface in order to generate a crystallized semiconductor film by using the light irradiation apparatus of the first aspect of the light irradiation method of the second aspect.

According to a fifth aspect of the present invention, there is provided a device manufactured by using the crystallization apparatus of the third aspect or the crystallization method of the fourth aspect.

According to a sixth aspect of the present invention, there is provided a light modulation element defined in claim 11.

This light modulation element preferably comprises a reference phase area having a reference phase value of 0 degree as a reference, a first phase-modulation area having a first modulation phase value as a phase-modulation having a positive value, and a second phase-modulation area having a second modulation phase value as a phase-modulation having a negative value which is substantially equal to an absolute value of the first modulation phase value as at least three types of phase areas mentioned above. In this case, it is preferable that a pattern with which an occupied area ratio of the first phase-modulation area to the reference phase area varies is substantially equal to a pattern with which an occupied area ratio of the second phase-modulation area to the reference phase area varies.

Since the crystallization apparatus and the crystallization method according to the present invention use a ternary modulation type light modulation element having such a complex amplitude transmittance distribution that a secondary derivative of a phase value of the complex amplitude distribution becomes substantially zero at a bottom portion of the V-shaped light intensity distribution in an image space of the image formation optical system, a desired V-shaped light intensity distribution can be stably formed on a crystallization surface without being substantially affected by defocusing, and crystal grains with substantially equal sizes can be generated on the semiconductor film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment according to the present invention will now be described with reference to the accompanying drawings.

Figure 1:
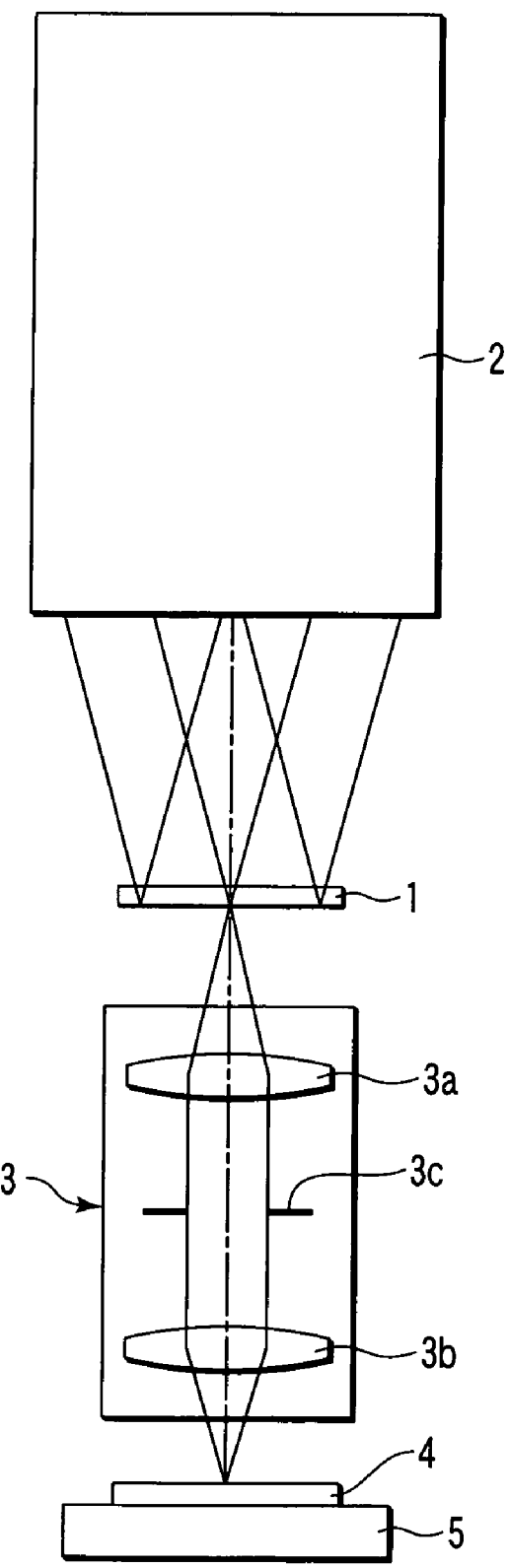
FIG. 1 is a view schematically showing a structure of a crystallization apparatus according to an embodiment of the present invention.
Figure 2:
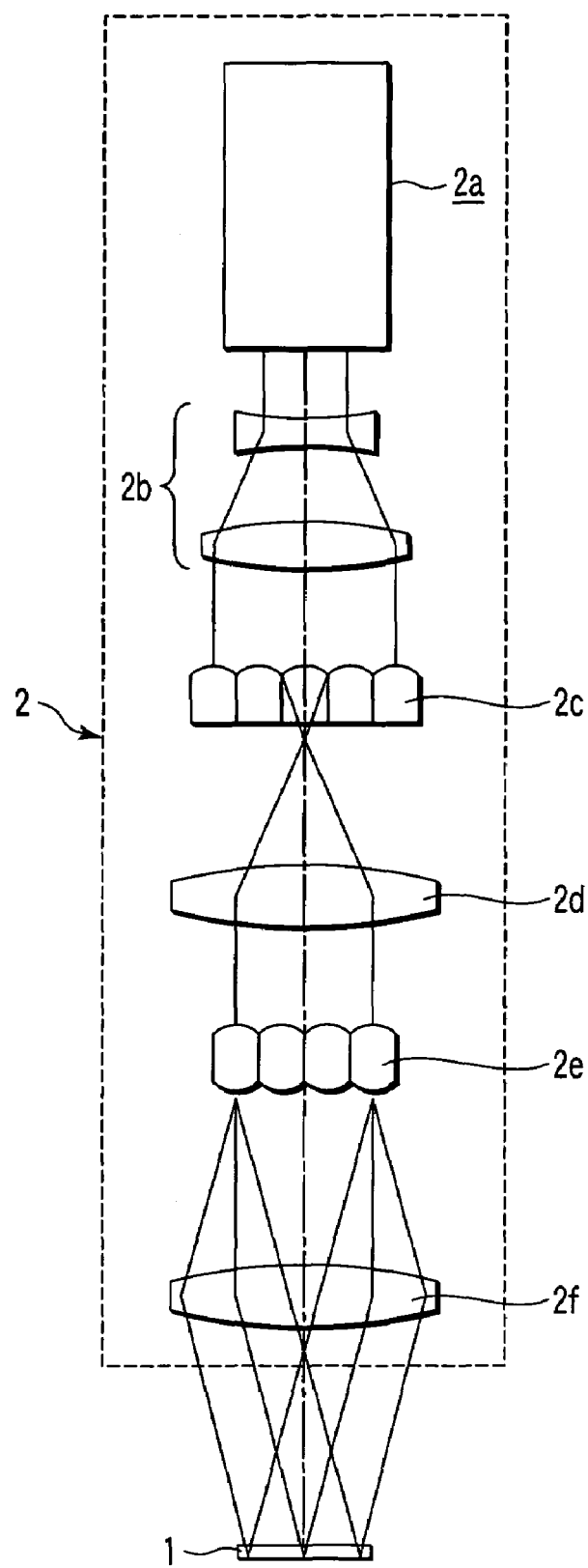
FIG. 2 is a view schematically showing an internal structure of an illumination system depicted in FIG. 1.

FIG. 1 is a view schematically showing a structure of a crystallization apparatus according to an embodiment of the present invention. Moreover, FIG. 2 is a view schematically showing an internal structure of an illumination system. Referring to FIG. 1, the crystallization apparatus according to this embodiment includes a light modulation element 1 which modulates a phase of an incident light beam, an illumination system 2, an image formation optical system 3, and a substrate stage 5. A processed substrate (a support substrate such as a glass substrate and a non-single-crystal semiconductor film directly or indirectly formed thereon) 4 is mounted on the stage 5. The detailed substructure and the effects of the light modulation element 1 will be described later.

As shown in FIG. 2, the illumination system 2 includes a light source 2a which outputs an energy light which fuses the non-single-crystal semiconductor film of the processed substrate 4. This light source is, e.g., a KrF excimer laser light source which supplies a pulse laser beam having a wavelength of, e.g., 248 nm. As this light source 2a, it is also possible to use any other appropriate light source such as an XeCl excimer laser light source or a YAG laser light source having a performance which projects an energy light beam which fuses a crystallization target substance such as a non-single-crystal semiconductor film. A laser beam exiting from the light source 2a is expanded through a beam expander 2b and then enters a first fly-eye lens 2c.

In this manner, a plurality of small light sources are formed on a rear focal surface of the first fly-eye lens 2c, and light rays from the plurality of small light sources illuminate an incident surface of a second flu-eye lens 2e in an overlapping manner through a first condenser optical system 2d. As a result, more light sources than those on the rear focal surface of the first fly-eye lens 2c are formed on a rear focal surface of the second fly-eye lens 2e. Light rays from the plurality of small light sources formed on the rear focal surface of the second fly-eye lens 2e illuminate the light modulation element 1 in an overlapping manner as a light beam, through the second condenser optical system 2f.

Here, the first fly-eye lens 2c and the first condenser optical system 2d constitute a first homogenizer, and this first homogenizer homogenizes an incidence angle of the laser beam supplied from the light source 2a on the light modulation element 1. Additionally, the second fly-eye lens 2e and the second condenser optical system 2f constitute a second homogenizer, and this second homogenizer homogenizes a light intensity of the laser beam, whose incidence angle is homogenized by the first homogenizer, at any in-plane position on the light modulation element 1. In this manner, the illumination system 2 illuminates the light modulation element 1 with the laser beam having a substantially homogeneous light intensity distribution.

The laser light or beam subjected to phase modulation by the light modulation 1 enters the processed substrate 4 through the image formation optical system 3. Here, the image formation optical system 3 arranges a pattern surface of the light modulation element 1 and the processed substrate 4 in an optically conjugate manner. In other words, a position of the processed substrate 4 is set on a surface (an image plane of the image formation optical system 3) which is optically conjugate with the pattern surface or plane of the optical modulation element 1. The image formation optical system 3 includes an aperture diaphragm 3c between a positive lens assembly 3a and a positive lens assembly 3b.

The aperture diaphragm 3c is one selected from a plurality of aperture diaphragms whose aperture positions (light transmission portions) have different sizes. The plurality of aperture diaphragms 3c are configured to be replaceable with respect to an optical path. Alternatively, an iris diaphragm which can continuously change a size of the aperture portion may be used as the aperture diaphragm 3c. In any case, a size of the aperture portion of the aperture diaphragm 3c (which is thus an image side numerical aperture NA of the image formation optical system 3) is set so that a necessary light intensity distribution is formed on the semiconductor film of the processed substrate 4 as will be described later. The image formation optical system 3 may be a refraction type optical system, a reflection type optical system, or a refraction/reflection type optical system.

The non-single-crystal semiconductor film of the processed substrate 4 is crystallized in processes of image formation of a laser beam phase-modulated by the light modulation element 1, fusion and solidification. The processed substrate 4 is obtained by sequentially forming an underlying film and an amorphous silicon film (a non-single-crystal semiconductor film) on, e.g., a liquid crystal display glass plate by chemical vapor deposition (CVD). The underlying insulating film is an insulating film of, e.g., $SiO_2$, avoids mixing of foreign particles such as Na into the amorphous silicon film from the glass substrate by direct contact of the amorphous silicon film and the glass substrate, and prevents a fusing temperature of the amorphous silicon film from being directly transmitted to the glass substrate.

The non-single-crystal film is not restricted to the non-single-crystal semiconductor film, and it may be, e.g., a metal other than a semiconductor. An insulating film such as an $SiO_2$ film as a cap film is formed on the amorphous silicon film. The cap film is heated by a part of the light beam which enters the amorphous silicon film, and stores a heated temperature. Although a temperature of a high-temperature portion is rapidly reduced on an irradiation target surface of the amorphous silicon film when incidence of the light beam is interrupted, this thermal storage effect alleviates this temperature drop gradient and facilitates crystal growth with a large particle size in a lateral direction. The processed substrate 4 is positioned and held at a predetermined position on the substrate stage 5 by a vacuum chuck, an electrostatic chuck or the like.

Prior to explanation of a structure and effects of the light modulation element 1 according to this embodiment, a description will now be given as to a principle that a V-shaped light intensity distribution asymmetrically changes its shape in dependence on a defocusing direction (defocusing distance) when a binary modulation type light modulation element having a modulation phase value other than 180 degrees is used.

In general, when the binary modulation type light modulation element is used, a complex amplitude distribution U at a focus position (a focal position) where an optical image phase-modulated by the light modulation element 1 is formed on the surface of the processed substrate 4 by the image formation optical system 3 can be approximately represented by the following Expression (1) while ignoring a proportionality coefficient (precisely, it is represented by convolution with a point spread function). In Expression (1), (X,Y) is an in-plane coordinate of the light modulation element, and T(X,Y) is a complex amplitude transmittance distribution of the light modulation element. Further, (x,y) is an in-plane coordinate of an image surface (a focus position) of the image formation optical system, and ∫ is an integration symbol in a point spread function range of the image formation optical system where a point on the light modulation element corresponding to the point (x,y) on the image surface is the center.

$$U(x,y) \approx \int T(X,Y)dXdY \quad (1)$$

That is, Expression (1) is led based on the following consideration.

The image formation by the image formation optical system is classified into coherent image formation when illuminated by a point light source, incoherent image formation when illuminated by a perfect diffusion light source, and partial coherent image formation corresponding to an intermediate state of the both types of image formation. The image formation by the actual optical system is the partial coherent image formation, and its light intensity distribution can be obtained by an expression led by H. H. Hopkins, but prospects are bad. Therefore, the discussion will be given while approximating the coherent image formation.

An amplitude distribution U(x,y) on the image surface in the coherent image formation can be obtained by a convolution calculation represented by the following Expression (1-a). (M. Born and E. Wolf, Principle of Optics, Chap. 9.5, 7th edition, Cambridge Univ. Press.)

$$U(x,y) = \int\int T(X,Y)PSF(x-s,y-t)dXdY \quad (1\text{-}a)$$

wherein PSF(x,y) indicates an amplitude point spread function (a complex amplitude distribution generated by a point object) of the image formation optical system.

On the other hand, the amplitude point spread function is given by Fourier transformation of a pupil function of the image formation optical system. Assuming that a pupil has a circular shape and an even transmittance, the amplitude point spread function PSF(x,y) can be given by the following Expression (1-b).

$$PSF(x, y) = \frac{2J_1(2\pi NAr/\lambda)}{2\pi NAr/\lambda} \quad (1\text{-}b)$$
$$r = \sqrt{x^2 + y^2}$$

wherein λ is a wavelength of a light beam, NA is a numerical aperture of the image formation optical system, and $J_1$ is a Bessel function.

Since it is hard to evaluate Expression (1-a) while keeping Expression (1-b), the amplitude point spread function is approximated with a function of a cylindrical shape with a radius R which surrounds the amplitude point spread function, has a matching bottom surface and a peak value positioned on an upper surface thereof. That is, the following expression can be obtained.

$$PSF(x, y) = \begin{cases} 1 & r < R \\ 0 & r > R \end{cases} \quad (1\text{-}c)$$
$$R = 0.61\lambda/NA$$

wherein R is a minimum radius r with which a right side of Expression (1-b) becomes 0. A range of a circular shape with the radius R is referred to as the "point spread function range" and represented by a symbol S. Then, Expression (1-a) is simplified into an integration of a complex amplitude transmittance T(X,Yy) in the point spread function range S with (x,y) at the center like Expression (1).

Figure 3A:
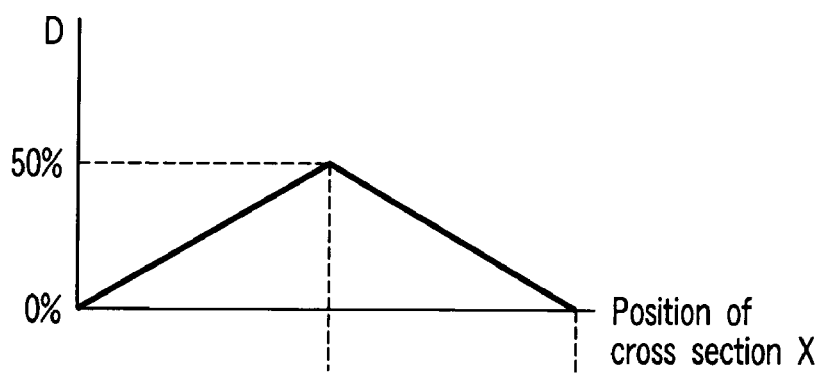
FIGS. 3A to 3D are views respectively schematically showing an occupied area ratio, an absolute value of a complex amplitude distribution, a phase value of the complex amplitude distribution and a light intensity when generating a V-shaped light intensity distribution by using a binary modulation type light modulation element having a modulation phase value of 180 degrees.
Figure 3B:
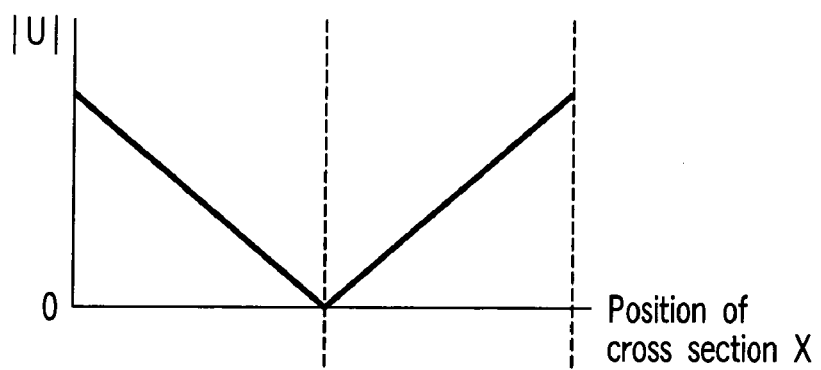
Figure 3C:
Figure 3D:
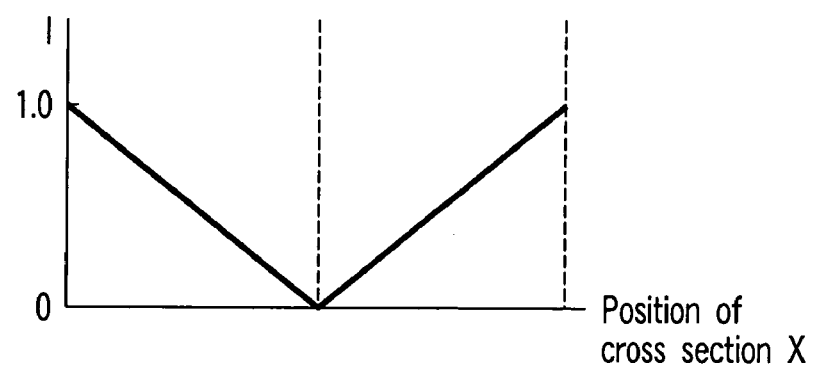

The "point spread function range" means a range surrounded by a line which becomes 0 or can be regarded as 0 (substantially 0) in the point spread function. In general, the point spread function range is represented by a circle which has a radius of 0.61λ/NA on the image surface assuming that NA is a numerical aperture of the image formation optical system and λ is a wavelength of a laser beam used, and the point spread function range has a value obtained by dividing this circle by a magnification on the light modulation element. Here, when the modulation phase value is 180 degrees, a value of the function T(X,Y) is a positive real number in the reference phase area having a reference phase value of 0 degree, and is a negative real number in the phase-modulation area having a modulation phase value of 180 degrees. In particular, even if an occupied area ratio (a duty) of the phase-modulation area varies from 0% to 5% as shown in FIG. 3A, a phase value of the complex amplitude distribution U remains unchanged from 0 degree as shown in FIG. 3C. It is to be noted that FIGS. 3A to 3D respectively schematically show an occupied area ratio D, an absolute value of the complex amplitude distribution U and a light intensity I (this value is in proportion to |U|²) when a V-shaped light intensity distribution is generated by using a binary modulation type light modulation element having a modulation phase value of 180 degrees.

Figure 4A:
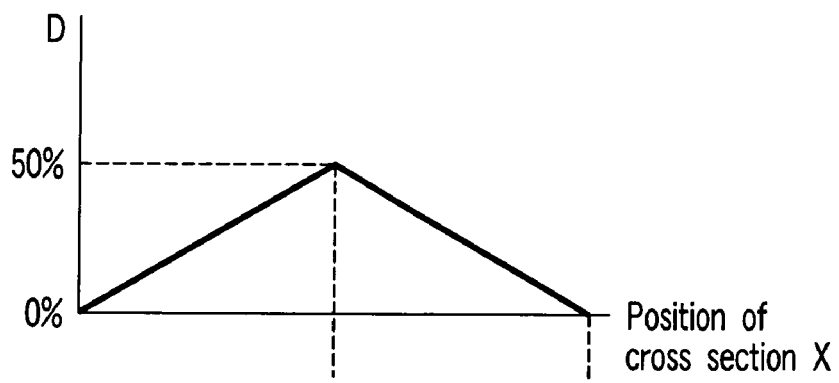
FIGS. 4A to 4D are views respectively schematically showing an occupied area ratio, an absolute value of a complex amplitude distribution, a phase value of the complex amplitude distribution and a light intensity when generating a V-shaped light intensity distribution by using a binary modulation type light modulation element having a modulation phase value other than 180 degrees.
Figure 4B:
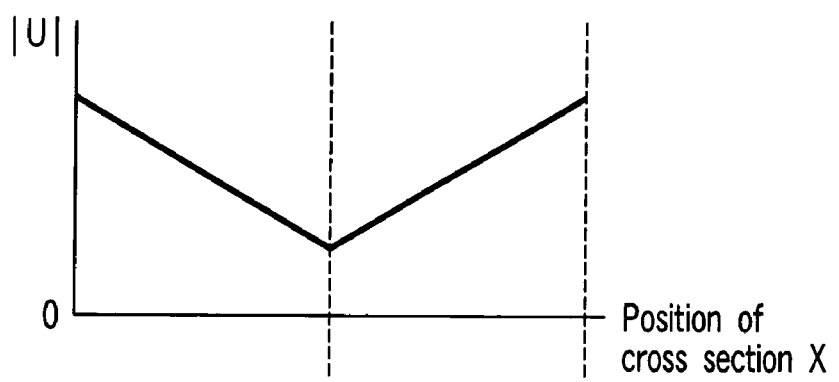
Figure 4C:
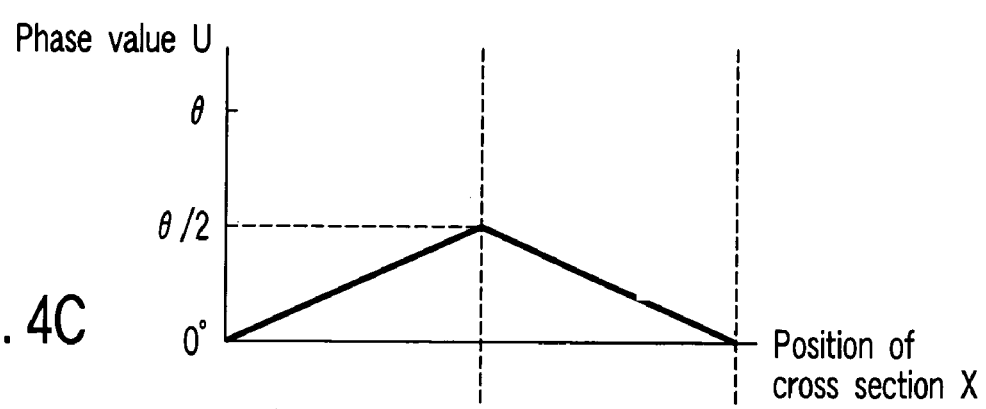
Figure 4D:
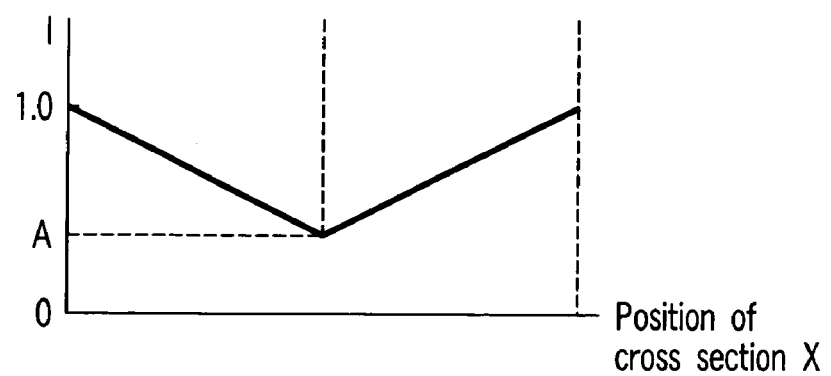

Alternatively, when a modulation phase value is a value θ other than 180 degrees (θ≠180), a value of the function T(X,Y) is an imaginary number, and consequently a value of the complex amplitude distribution U is also an imaginary number. Further, when an occupied area ratio (a duty) of the phase-modulation area varies from 0% to 50% as shown in FIG. 4A, a phase value of the complex amplitude distribution U changes from 0 degree to θ/2 as shown in FIG. 4C. FIGS. 4A to 4D respectively schematically show an occupied area ratio D, an absolute value |U| of the complex amplitude distribution U, a phase value of the complex amplitude distribution U and a light intensity I when a V-shaped light intensity distribution is generated by using a binary modulation type light modulation element having a modulation phase value other than 180 degrees.

A description will now be given as to a change in light intensity distribution caused due to defocusing when a binary modulation type light modulation element is used. A complex amplitude distribution Ud(x,y) at a defocus position is represented by the following Expression (2) (see "Optical Information Processing" by Junpei Tsujinai et al., edited by The Japan Society of Applied Physics, Ohmsha, p. 8 and others, the entire contents of which are incorporated herein by reference).

$$Ud(x,y) = U(x,y) * Z(x,y) \quad (2)$$

In Expression (2), * is an operator representing convolution (convolution integral), and U(x,y) is a complex amplitude distribution at a defocus position (a focal position) as described above.

In Expression (2), Z(x,y) is a point spread function expression Fresnel diffraction, and represented by the following Expression (3).

$$Z(x,y) = \exp\{ik(x^2+y^2)/2d\} \quad (3)$$

where k=2π/λ

In Expression (3), k is a wave number, and d is a defocus quantity (defocus distance). As to a sign of d, a defocus quantity in a direction apart from the image formation optical system has a positive sign, and a defocus quantity in a direction closer to the image formation optical system has a negative sign.

Figure 5A:
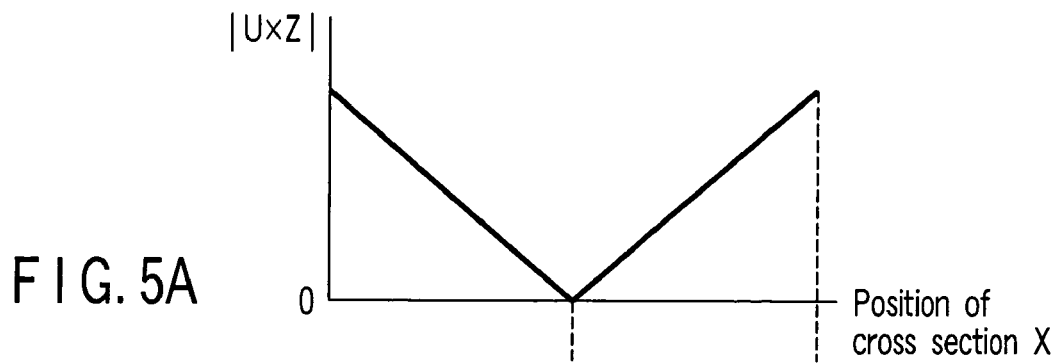
FIGS. 5A and 5B are views respectively schematically showing |UxZ| and a phase value of UxZ when generating a V-shaped light intensity distribution by using a binary modulation type light modulation element having a modulation phase value of 180 degrees.

A condition of convolution at a point at the bottom of a V-shaped light intensity distribution formed by using a binary modulation type like modulation element will now be considered. FIG. 5A one-dimensionally (X axis) shows an absolute value |UxZ| of a value obtained by multiplying U(x,y) by Z(x,y) in case of generating a V-shaped light intensity distribution by using a binary modulation type light modulation element having a modulation phase value of 180 degrees. However, in this case, an origin of Z is matched with the center of the V shape. That is, assuming that a central coordinate of the V shape is $(x_0, y_0)$, there can be achieved $UxZ \equiv U(x,y) \times Z(x-x_0, y-y_0)$. Furthermore, FIG. 6A one-dimensionally (X axis) shows an absolute value |UxZ| of a value obtained by multiplying U(x,y) by Z(x,y) in case of generating a V-shaped light intensity distribution by using a binary modulation type light modulation element having a modulation phase value θ other than 180 degrees (θ≠180). A result obtained by integrating |UxZ| shown in FIGS. 5A and 6A by the entire horizontal axis (a distance in the lateral direction is indicated as a position of an A cross section) is the complex amplitude distribution at a point at the bottom of the V-shaped light intensity distribution.

Figure 5B:
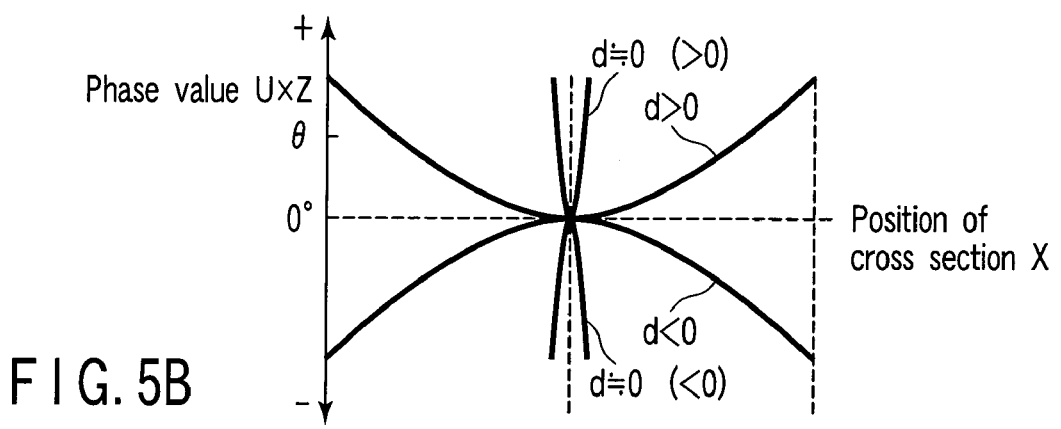

Since an absolute value |Z| of Z is 1, an absolute value |UxZ| of UxZ is equal to an absolute value |U| of U. Furthermore, by multiplying Z by U, a phase which is in proportion to a square of a distance from the point in question is added. A sign of this phase increase corresponds to a defocus direction (a sign of a defocus quantity). That is, a sign of the phase increase is a positive sign in case of d>0, and a sign of the phase increase is a negative sign in case of d<0. As shown in FIG. 5B, in case of generating a V-shaped light intensity distribution by using a binary modulation type light modulation element having a modulation phase value of 180 degrees, a phase value of UxZ symmetrically varies with respect to a sign of a defocus quantity d. Therefore, a result of integration involved by convolution also becomes symmetrical with respect to a sign of the defocus quantity d.

Figure 6A:
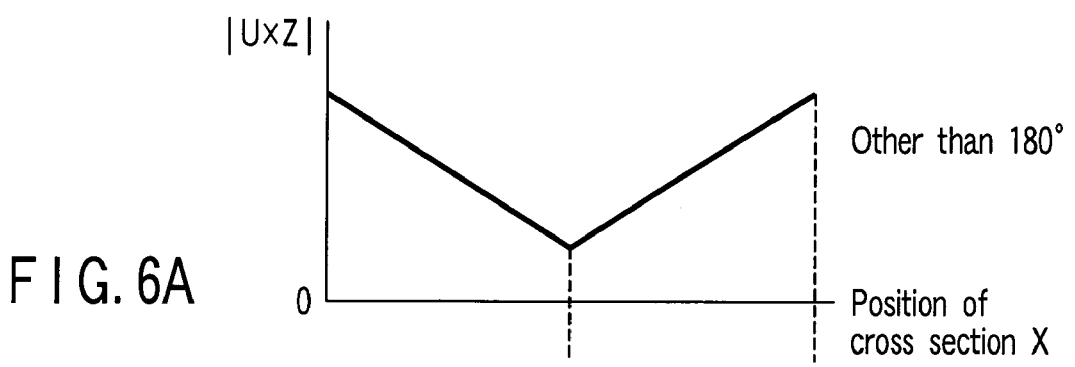
FIGS. 6A and 6B are views respectively schematically showing |UxZ| and a phase value of UxZ when generating a V-shaped light intensity distribution by using a binary modulation type light modulation element having a modulation phase value other than 180 degrees.
Figure 6B:
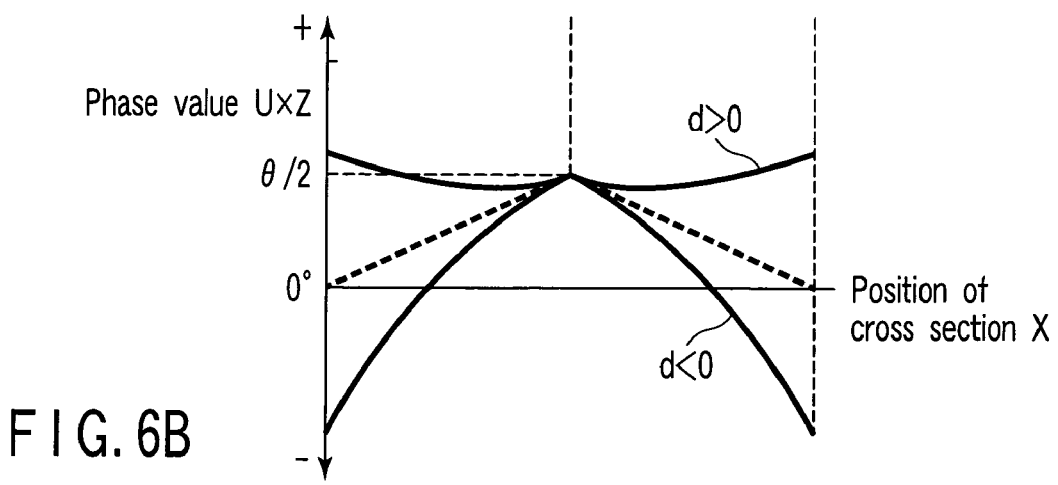

Alternatively, as shown in FIG. 6B, in case of generating a V-shaped light intensity distribution by using a binary modulation type light modulation element having a modulation phase value θ other than 180 degrees (θ≠180), a phase value of UxZ asymmetrically varies with respect to a sign of a defocus quantity d. Therefore, a result of integration involved by convolution also becomes asymmetrical with respect to a sign of the defocus quantity d. In FIG. 5B, the defocus quantity d represented in a phase term (a right side) of the equation (3) is a denominator, so that a parabola represented by the equation (3) becomes open as the defocus quantity d increases.

Specifically, as apparent from FIG. 6B, in case of d>0, since a change quantity of a phase becomes small in the vicinity of a point in question, a light intensity is increased taking the integration into consideration. On the contrary, in case of d<0, since a change quantity of the phase becomes large in the vicinity of the point in question, a light intensity is reduced taking the integration into consideration. Such tendencies match with the calculation result mentioned above.

Summing up this consideration, it can be understood that a factor of the asymmetrical change of the V-shaped light intensity distribution with respect to a sign of defocusing is that a phase value of U varies in a substantially curved manner rather than a linear manner in accordance with a bottom portion of |UxZ| at a focus position (d=0), namely, a secondary derivative of the phase value of U is not substantially zero. In other words, it can be understood that the V-shaped light intensity distribution symmetrically varies with respect to a sign of defocusing by setting the secondary derivative of the phase value of U to substantially zero. As a solution for this problem, the present invention adopts the following two techniques.

The first technique is a "ternary modulation method" which sets a secondary derivative of a phase value of a complex amplitude distribution as substantially zero at a bottom portion (the minimum light intensity portion) of a V-shaped light intensity distribution in an image space of the image formation optical system by using a light modulation element having three or more types of modulation phase values, e.g., a ternary modulation type light modulation element having one reference phase value and two modulation phase values. The second technique is a "defocus method" which arranges an irradiation target surface at such a position that a secondary derivative of a phase value of a complex amplitude distribution becomes substantially zero at a bottom portion of a V-shaped light intensity distribution in an image space of the image formation optical system.

Figure 7:
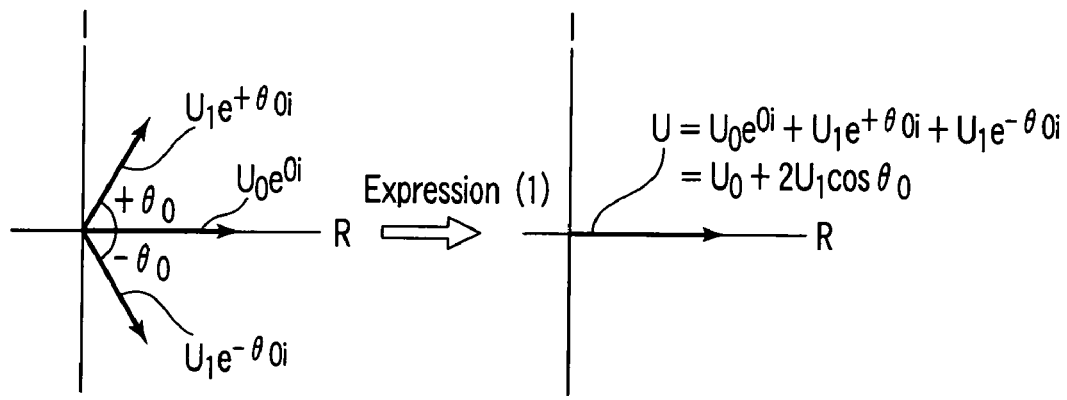
FIG. 7 is a view illustrating that a secondary derivative of a phase value of a complex amplitude distribution U can be set to 0 in a ternary modulation method.

A description will be given as to an example where a secondary derivative of a phase value of a complex amplitude distribution U can be set as zero in the ternary modulation method with reference to FIG. 7. In FIG. 7, a vertical axis I represents Imaginary, and a horizontal axis R represents Real. As an example, phases of three values are determined as 0, $+\theta_0$ and $-\theta_0$. Integration in Expression (1) can be modified into the following form.

$$U(x, y) = U_0 e^{0i} + U_1 e^{+\theta_0 i} + U_1 e^{-\theta_0 i}$$
$$= U_0 + U_1(\cos\theta_0 + i\sin\theta_0) + U_1(\cos\theta_0 - i\sin\theta_0)$$
$$= U_0 + 2U_1 \cos\theta_0$$

That is, the phase of the complex amplitude distribution U can be set as substantially zero by using the three values. Therefore, the secondary derivative of the complex amplitude distribution U can be of course set as substantially zero as well. It is to be noted that a combination of 0, $+\theta_0$ and $-\theta_0$ is used in this example, but there are other combinations by which a calculation result of Expression (1) becomes a phase zero (substantially zero). Besides the ternary modulation method, it is possible to use a modulation method utilizing a plurality of values, e.g., four values or five values. Moreover, as to the light modulation element, the description has been given as to the example where the phase value of the complex amplitude distribution is substantially zero in the image space of the image formation optical system 3, the phase value does not have to be substantially zero as long as the secondary derivative can be set as substantially zero.

A light intensity I obtained by using the ternary modulation method can be approximately represented by the following Expression (4).

$$I \approx \{2D\cos\theta + (1-2D)\}^2 \quad (4)$$

In Expression (4), θ is an absolute value of two modulation phase values having different signs and the same absolute value. D is an occupied area ratio of two phase-modulation areas which vary in accordance with the same pattern. The occupied area ratio D of each phase-modulation area with respect to the reference phase area takes a value between 0 and 0.5.

The fact "the light modulation element has such a complex amplitude transmittance distribution that the secondary derivative of the phase value of the complex amplitude distribution is nearly zero or substantially zero at the minimum light intensity portion (the bottom portion of an inverse peak pattern) of the V-shaped light intensity distribution in the image space of the image formation optical system" means nothing else that the following Expression (5) and (6) are satisfied taking Expression (1) into consideration. In Expression (5) and (6), (X,Y) is an in-plane coordinate of the light modulation element, T(X,Y) is a complex amplitude transmittance distribution of the light modulation element, (x,y) is an in-plane coordinate of the image surface of the image formation optical system, $\int$ is an integration symbol in the point spread function range of the image formation optical system where a point on the light modulation element corresponding to the point (x,y) on the image surface is the center, and arg is a function which is used to obtain a phase value.

$$(\delta^2/\delta x^2)\arg(\int T(X,Y)dXdY) \approx 0 \quad (5)$$

$$(\delta^2/\delta y^2)\arg(\int T(X,Y)dXdY) \approx 0 \quad (6)$$

Figure 8A:
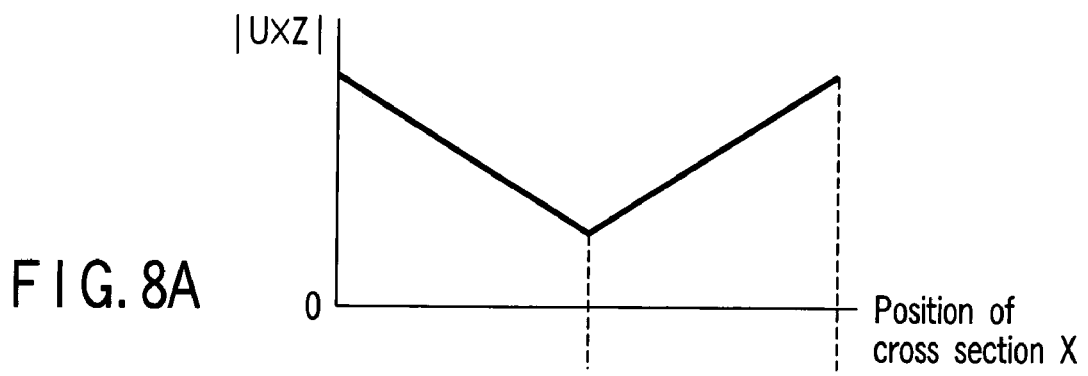
FIGS. 8A and 8B are views of convolution associated with FIGS. 6A and 6B, illustrating a principle of a defocus method.
Figure 8B:
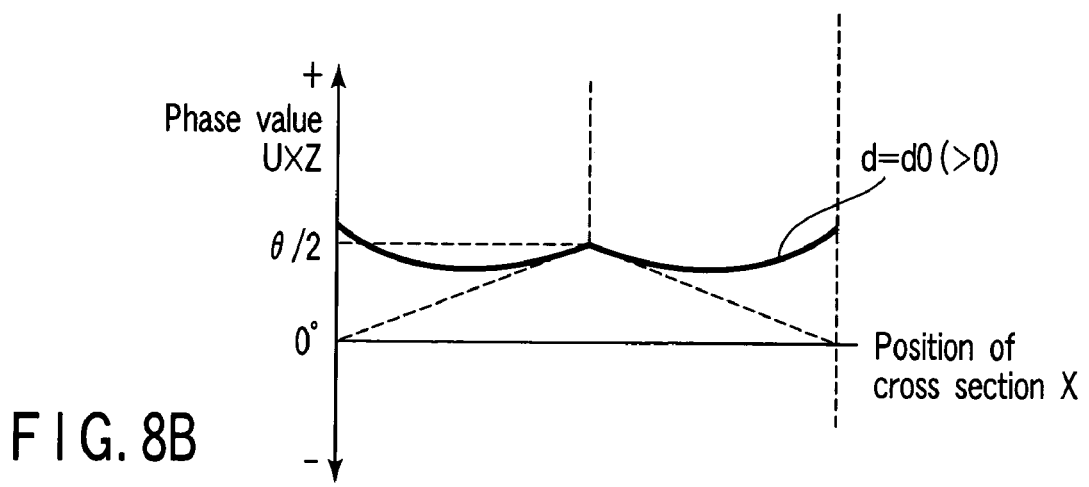

A description will now be given as to a principle of the defocus method as the second technique with reference to FIGS. 8A and 8B of convolution associated with FIGS. 6A and 6B.

In the defocus method, a predetermined defocus position is intentionally assumed as a pseudo-focus position, and an irradiation target surface is set at the assumed pseudo-focus position. In this example, as the pseudo-focus position, there is used a position at which a change quantity of a phase of the complex amplitude distribution U involved by defocusing is relatively small. In FIGS. 8A and 8B, a new defocus position having a defocus quantity of d0 (d=d0) is assumed as the pseudo-focus position.

In this case, the pseudo-symmetry which is not the perfect symmetry with respect to a phase value of UxZ can be obtained with the second defocus position (d=d0) as the pseudo-focus position being determined at the center. Since a light intensity distribution at this new light irradiation position, i.e., the pseudo-focus position is different from a light intensity distribution at the true focus position (a focal position) to some extent, it is desirable to correct a pattern of the light modulation element in order to compensate a quantity of difference between the light intensity distributions. As a technique for this correction, although not restricted to a certain type, there is a method which corrects an occupied area ratio of the phase-modulation area with respect to the reference phase area, for example.

Figure 9:
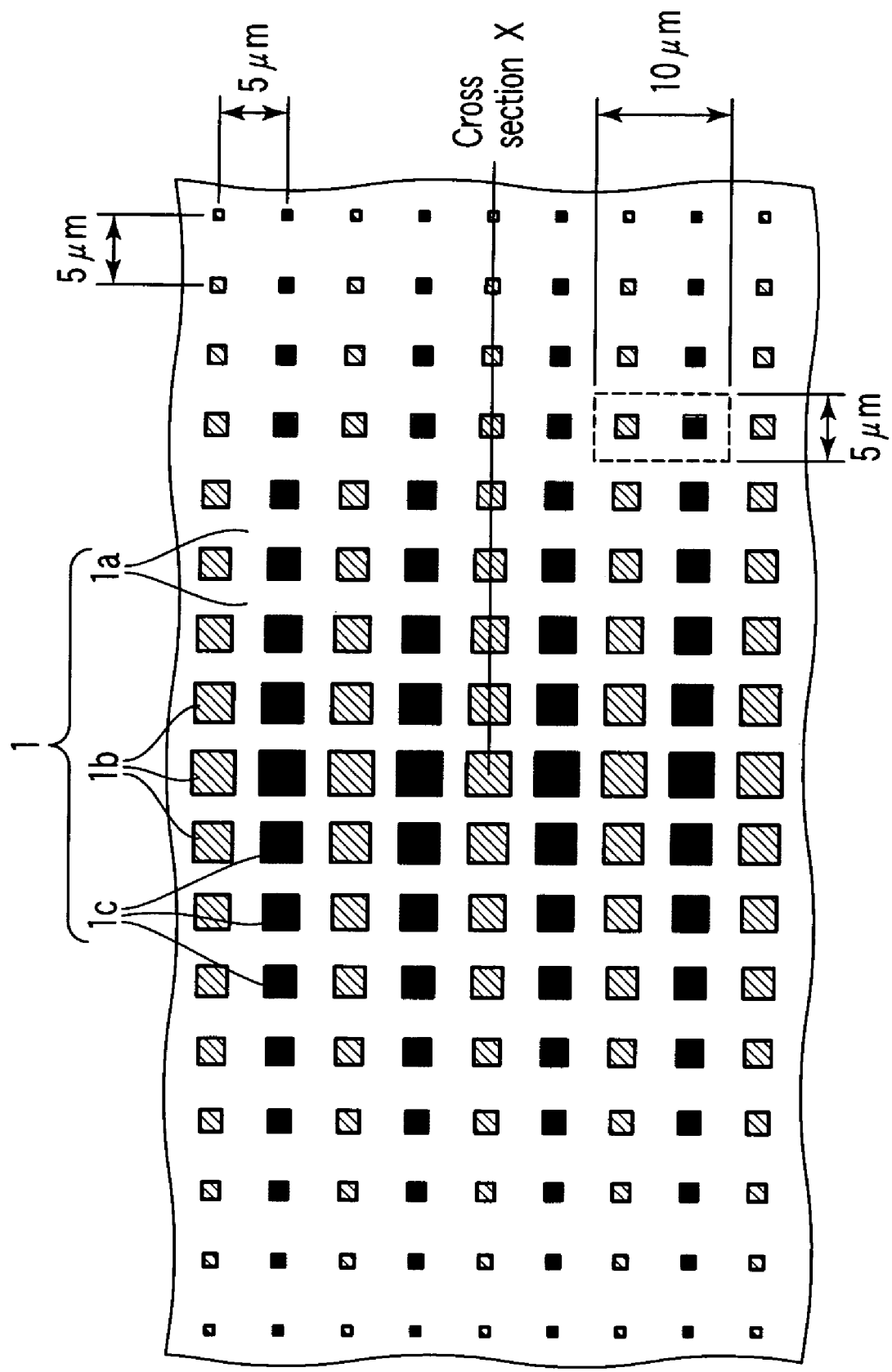
FIG. 9 is a view schematically showing a phase pattern of a ternary modulation type light modulation element according to the embodiment.

FIG. 9 is a view schematically showing a phase pattern of a ternary modulation type light modulation element according to this embodiment. The light modulation element 1 according to this embodiment is a ternary modulation type light modulation element based on the first technique mentioned above, and has a reference phase area (indicated by a blank portion in the figure) 1a having a reference phase value of 0 degree, each rectangular first phase-modulation area (indicated by a shaded portion in the figure) 1b having a modulation phase value of 60 degrees, and each rectangular second phase-modulation area (indicated by a black portion in the figure) 1c having a modulation phase value of −60 degrees. In this example, the phase-modulation areas 1b and 1c are arranged in a matrix form in vertical and horizontal directions (a lateral direction (X cross section) and a direction orthogonal to the former direction) in accordance with a pitch of 5 μm.

An occupied area ratio (a duty) of the first phase-modulation area 1b and an occupied area ratio of the second phase-modulation area 1c linearly vary between 0% and 25% along the horizontal direction in the drawing (along the X cross section). Specifically, an occupied area ratio of the first phase-modulation area 1b is 0% on both sides of the phase pattern along the horizontal direction, and an occupied area ratio of the first phase-modulation area 1b is 25% at the center. Likewise, an occupied area ratio of the second phase-modulation area 1c is 0% on both sides of the phase pattern along the horizontal direction, and an occupied area ratio of the first phase-modulation area 1c is 25% at the center.

Moreover, a group of first phase-modulation areas 1b and a group of second phase-modulation areas 1c whose occupied area ratios vary in accordance with the same pattern along the horizontal direction (along the X cross section) in the figure are alternately formed in the perpendicular direction in the drawing. A unit area which includes the phase-modulation areas 1b and 1c and is defined by a pitch of 5 μm, i.e., a rectangular unit area of 5 μm×10 μm (a rectangular unit area which includes one phase-modulation area 1b and one phase-modulation area 1c and is indicated by a broken line in FIG. 9) has dimensions which are not greater than the point spread function range of the image formation optical system 3. In other words, the ternary modulation type light modulation element 1 according to this embodiment has a phase modulation unit whose dimensions (dimensions converted into a counterpart on the light modulation element 1) are not greater than the point spread function range of the image formation optical system 3.

As described above, the ternary modulation type light modulation element 1 according to this embodiment has three types of phase areas (1a, 1b and 1c) having different fixed phase values (0 degree, 60 degrees and −60 degrees), and occupied area ratios of these areas vary in accordance with a predetermined pattern. The "fixed phase value" means a phase value fixedly set over a given area. In this example, the three types of phase areas (1a, 1b and 1c) are the reference phase area 1a having the reference phase value of 0 degree as a reference, the first phase-modulation area 1b having the first modulation phase value (60 degrees) which is a phase-modulation having a positive value, and the second phase-modulation area 1c having the second phase-modulation (−60 degrees) which is a phase-modulation having a negative value. A pattern with which an occupied area ratio of the first phase-modulation area 1b with respect to the reference phase area 1a varies is equal to a pattern with which an occupied area ratio of the second phase-modulation area 1c with respect to the reference phase area 1a varies. The ternary modulation type light modulation element 1 according to this embodiment is a light modulation element based on the first technique according to the present invention as mentioned above, and is designed to have such a complex amplitude transmittance distribution that a secondary derivative of a phase value of the complex amplitude distribution becomes substantially zero at a bottom portion of a V-shaped light intensity distribution in an image space of the image formation optical system 3.

The pattern shown in FIG. 9 is one of many equal patterns of an actual light modulation element, and it can be understood that many light intensity distributions having an inverse peak pattern or a V shape can be simultaneously formed by arranging the light modulation element so that these patterns are repeated in a direction of the X cross section, and the minimum light intensity portion has a linear shape by arranging the light modulation element so that these patterns are repeated in a direction orthogonal to the direction of the X cross section.

The aforementioned light modulation element is an optical element which modifies a phase of an incident light beam to form a V-shaped light intensity distribution having a bottom portion of a minimum light intensity on a determined surface. The light irradiation apparatus is a device in which the light beam modulated by the light modulation element irradiates the predetermined surface such as an irradiation surface of a target (for example, a non-crystal surface), by an image formation system to form said V-shaped light intensity distribution on said surface.

The light modulation element is formed by a transparent substrate such as quartz glass substrate having a transparency for the incident light beam, as shown in FIG. 9. In the upper surface of the substrate there are formed a plurality of rectangular recess portions (corresponding to regions 1b) of different areas as first phase-modulation areas or regions having a positive phase value except for 180 degrees. The rectangular recess portions may be formed by a conventional photolithography technique such as a dry etching. In the invention, as a mark of the modulation phase value, positive mark represents a phase-proceeding state, and negative mark shows a phase delaying state.

More specifically, the recess portions may be formed as follows. A resist film is formed on an upper surface of the quartz glass substrate, and then the film is selectively exposed using a chrome mask in an exposing step. Next, a developing step is accomplished for the exposed resist film to form a resist pattern on the substrate. The upper surface of the substrate is selectively dry-etched using the resist pattern. Then, the resist pattern is removed from the substrate, so that a plurality of recess portions are formed in the upper surface of the substrate.

At portions of the transparent substrate proximate to the first phase-modulation areas or regions, there are also formed a plurality of second phase-modulation areas each having a negative phase value of other than 180 degrees. The second phase-modulation regions have different areas. The second regions (corresponding to the areas 1c in FIG. 9) may also shaped in a rectangular projection, and have same plane-size, plane-shape and pattern as the first regions. The absolute value of the phase value of positive and negative marks equals, and may be any degree other than 180 degrees, for example 60 degrees.

The second phase-modulation regions 1c may be so formed that after formation of the first phase-modulation regions 1b, the same etching process as formation of the first regions is applied to the upper surface of the substrate, using a pattern corresponding to the second regions. Alternately the steps forming the first and second regions may be reverse, that is the first regions 1b may be formed after the second regions 1c are formed.

Next, there will now be described one example of manufacturing the aforementioned light modulation element with reference to FIGS. 9A to 9G.

Figure 9A:
FIGS. 9A to 9G are process cross-sectional views showing an example of a manufacturing process for the ternary modulation type light modulation element as shown in FIG. 9.
Figure 9B:
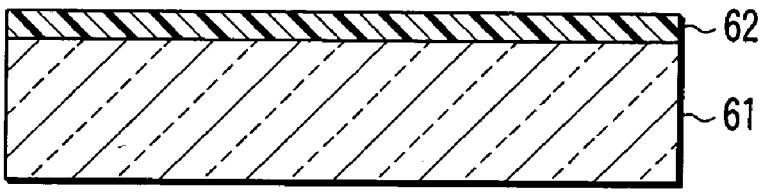
Figure 9C:
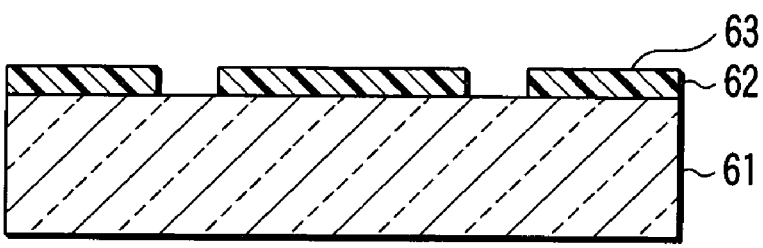
Figure 9D:
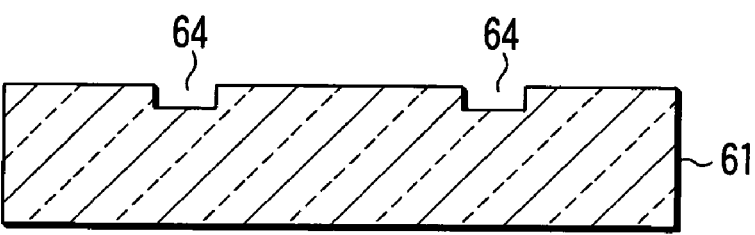

A quartz glass substrate 61 as a transparent substrate for the light modulation element is prepared, as shown in FIG. 9A. Next, as shown in FIG. 9B, a resist film 62 is formed on an upper surface of the substrate 61. The resist film 62 is selectively exposed with light, using a mask for forming first or second phase-modulation areas (In this embodiment, first phase-modulation areas). Then, the resultant resist film 62 is selectively etched to form a resist pattern 63 for first phase-modulation areas on the upper surface of the substrate 61, as shown in FIG. 9C. The upper surface of the substrate 61 is selectively etched, using the resist pattern 63, and then the resist pattern 63 is removed from the substrate, so that first phase-modulation areas 64 are formed on the upper surface of the substrate 61, as shown in FIG. 9D.

Next, second phase-modulation areas are formed on the substrate to be juxtaposed with the first phase-modulation areas as follows.

Figure 9E:
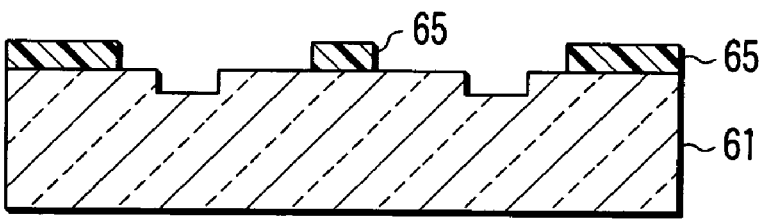
Figure 9F:
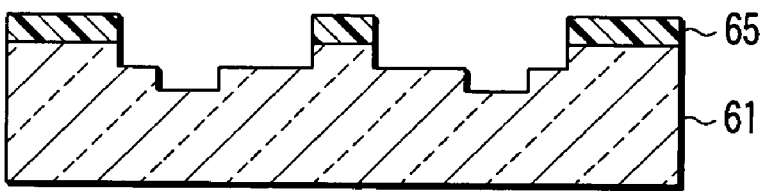
Figure 9G:
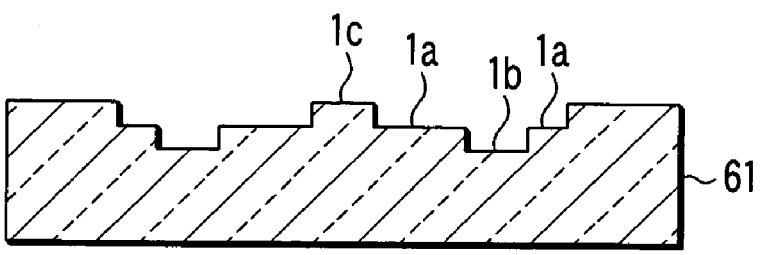

First, a resist film is formed on the upper surface of the substrate 61 on which the first phase-modulation areas 64 have been provided. The resist film is selectively exposed with light, using a mask for forming second phase-modulation areas. Then, the resultant resist film is selectively etched to form a resist pattern 65 for second phase-modulation areas on the upper surface of the substrate 61, as shown in FIG. 9E. The portions of the upper surface of the substrate 61, which are not covered with the second pattern 65 are selectively etched, using the resist pattern 65, as shown in FIG. 9F. Next, the resist pattern 65 is removed from the substrate, so that a reference phase area 1a, and first and second phase-modulation areas 1b and 1c are formed on the upper surface of the substrate 61, as shown in FIG. 9G. The dimensions and arrangement of the first and second phase modulation regions 1b and 1c of a square shape are set as shown in FIG. 9. More specifically, the first and second phase-modulation regions are arranged in rows (lateral direction) and columns in each unit. The rows are of two types, one consisting of first regions 1b, and the other consisting of second regions 1c. The rows of two types are alternately arranged. In each row of either type, the middle region the largest, and the other regions on either sides of the largest gradually decreased in size toward the end of the column in the unit. The first and second regions 1b and 1c forming each column have the same size.

The shape of the regions 1b and 1c is not limited to the aforementioned square, and may be a suitable shape having a desired area, such as circular, ellipse or triangle.

Next, there will be described an example of forming a phase-modulation region having a desired phase value on a quartz glass substrate.

The phase value for phase-modulating an incident light beam may be provided, for example, by forming steps on a light-incident surface of the substrate. The phase modulation for the incident light beam occurs due to difference of indexes of refraction on both sides of the boundary (step).

Thickness of the step is represented by the following equation.

$$T = \lambda \Phi / 2\pi (n-1)$$

Here, $\lambda$ is a wave length of the incident light beam, $\Phi$ a phase value represented by radian, and n an index of refraction of a material forming the step. Thus, the desired step t may be obtained by selecting a substrate material having an index of refraction and an incident light having a wavelength. These constants may be set by forming a film on a transparent substrate by a material having a desired index of refraction, using such as PECVD or LPCVD, or etching the surface of a transparent substrate.

Although the light modulation element shown in FIG. 9 is formed by arranging the rectangular phase-modulation areas in a matrix form, the shapes and/or arrangements of the phase-modulation areas are not restricted thereto. For example, the phase-modulation area may have any other shape such as a circular shape, and any other arrangement conformation such as a zigzag arrangement can be adopted.

Figure 10A:
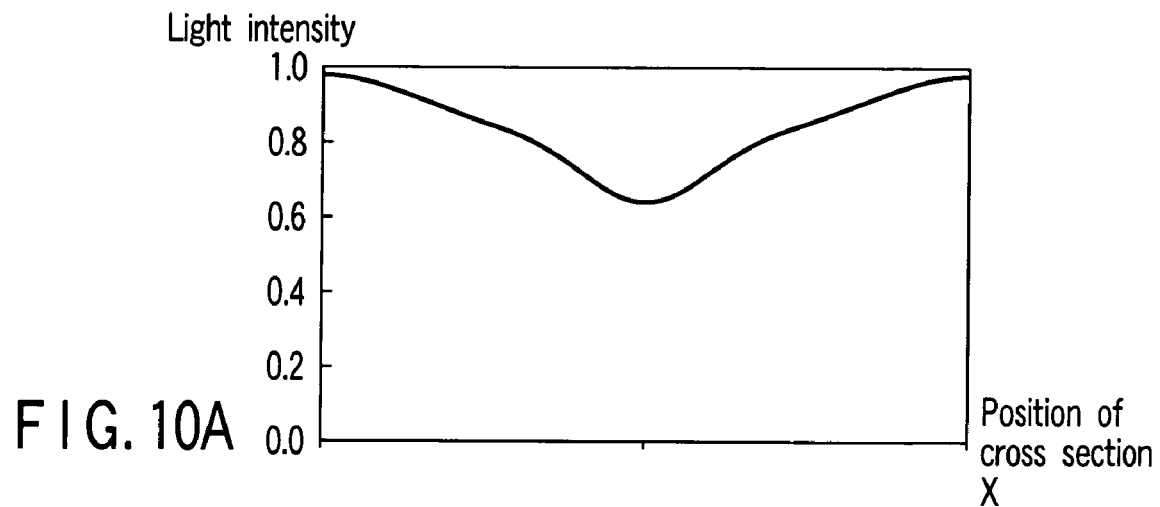
FIGS. 10A to 10C are views respectively showing a V-shaped light intensity distribution formed through an image formation optical system when the ternary modulation type light modulation element according to the embodiment is used.
Figure 10B:
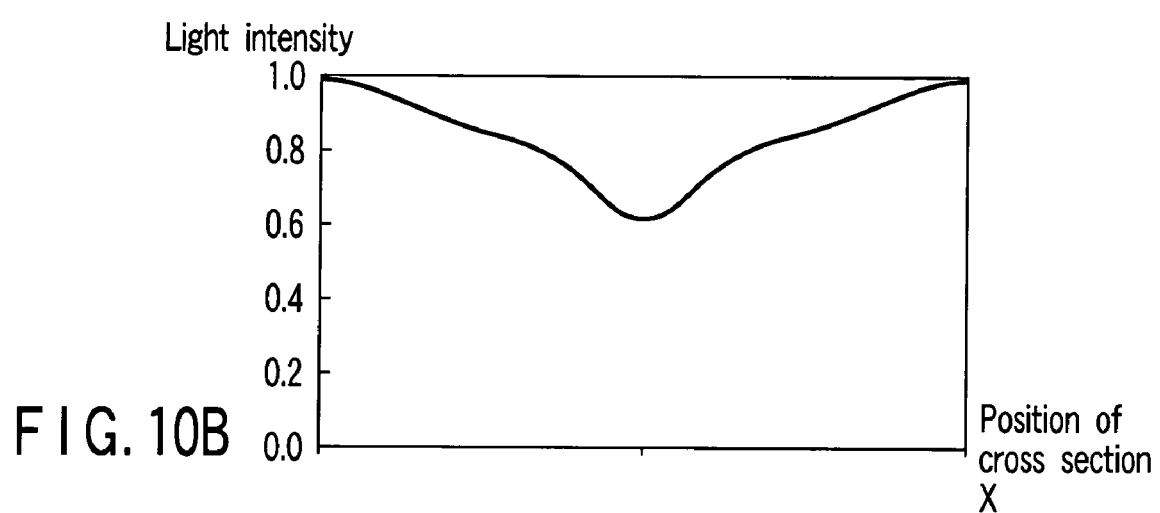
Figure 10C:
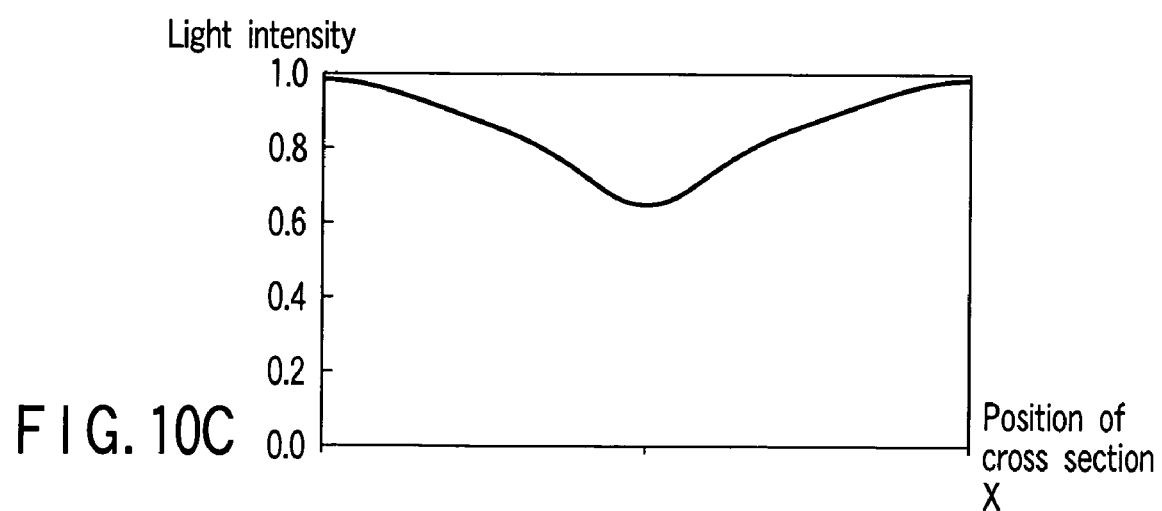

FIGS. 10A to 10C are views each showing a V-shaped light intensity distribution formed through the image formation optical system when the ternary modulation type light modulation element according to this embodiment is used. The light intensity distribution shown in each of these drawings is calculated on the assumption that a wavelength λ of a light is 248 nm, an image side numerical aperture NA of the image formation optical system 3 is 0.13, an image formation magnification of the image formation optical system 3 is ⅕ and a value δ (a coherence factor) of the image formation optical system 3 is 0.47. Additionally, FIG. 10B shows a light intensity distribution obtained at a focus position along the X cross section, FIG. 10A shows a light intensity distribution obtained at a defocus position of −5 μm (a position slightly moved from the focus position by 5 μm in a direction closer to the image formation optical system 3) along the X cross section, and FIG. 10C shows a light intensity distribution obtained at a defocus position of +5 μm (a position slightly moved from the focus position by 5 μm in a direction apart from the image formation optical system 3) along the X cross section.

When the ternary modulation type light modulation element 1 according to this embodiment is used, as shown in FIG. 10B, a substantially ideal V-shaped light intensity distribution is formed at the focus position (the image formation surface) of the image formation optical system 3. Further, even if the irradiation target surface is defocused by ±5 μm as shown in FIGS. 10A and 10C, a shape of the V-shaped light intensity distribution formed on the irradiation target surface slightly changes due to defocusing, and this change is substantially symmetrical (symmetrical in the lateral direction with the minimum light intensity portion being determined at the center) without being dependent on a direction of defocusing. In this embodiment, in order for production of the light modulation element 1 to become relatively each, occupied area ratios of the phase-modulation areas 1b and 1c are set to 0 to 0.25, and the V-shaped light intensity distribution with a relatively shallow bottom is realized.

As described above, the crystallization apparatus according to this embodiment uses a light modulation element, e.g., a ternary modulation type light modulation element 1 having such a complex amplitude transmittance distribution that a secondary derivative of a phase value of a complex amplitude distribution becomes substantially zero at a bottom portion of a V-shaped light intensity distribution in an image space of the image formation optical system 3. Therefore, a desired V-shaped light intensity distribution can be stably formed without being substantially affected by defocusing caused due to a board thickness deviation unavoidably existing in, e.g., the processed substrate 4, thereby substantially evenly generating crystal grains on a semiconductor film. Further, in this embodiment, since a substantially ideal V-shaped light intensity distribution may be stably formed, crystal grains can be formed in a semiconductor film with a high filling factor.

Figure 11A:
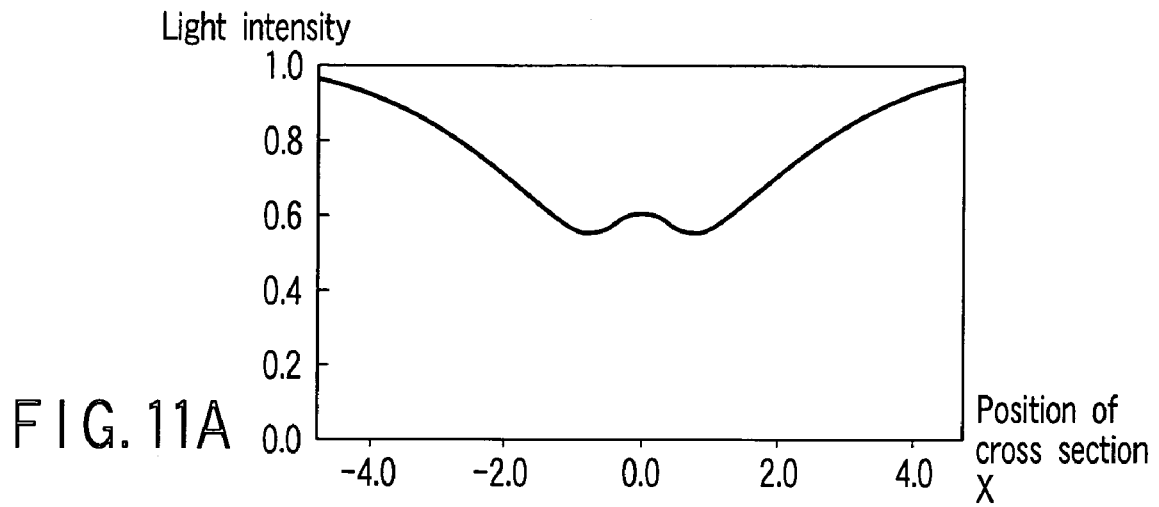
FIGS. 11A to 11C are first views schematically showing each V-shaped light intensity distribution formed through an image formation optical system when a binary modulation type light modulation element is used in a modification of the embodiment.
Figure 11B:
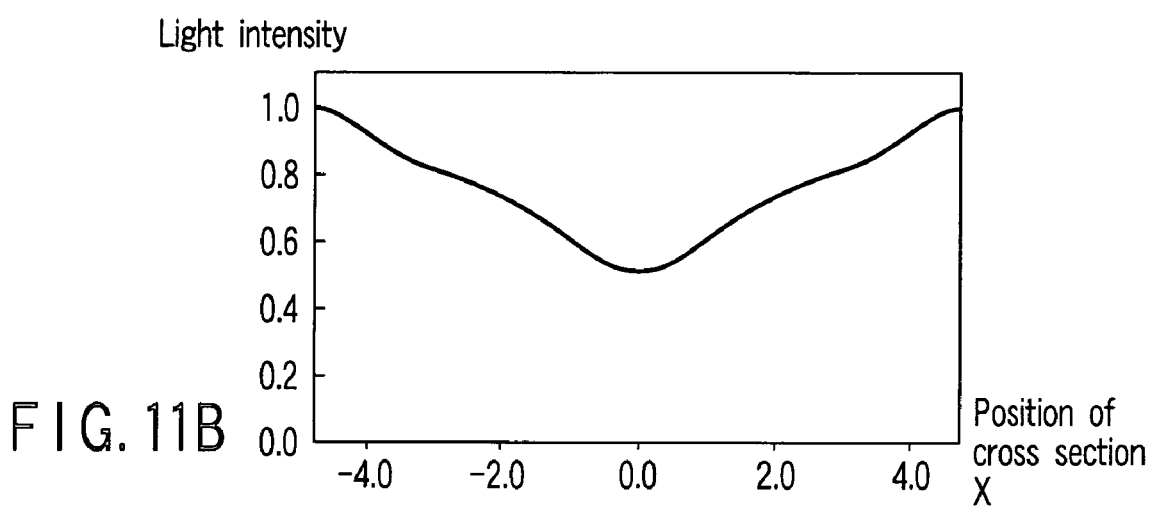
Figure 11C:
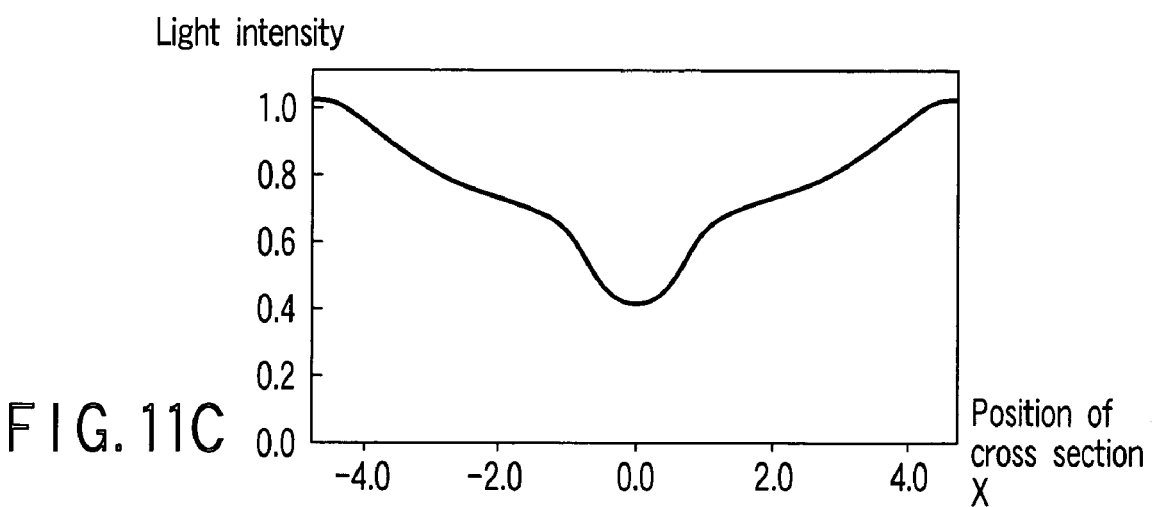
Figure 12A:
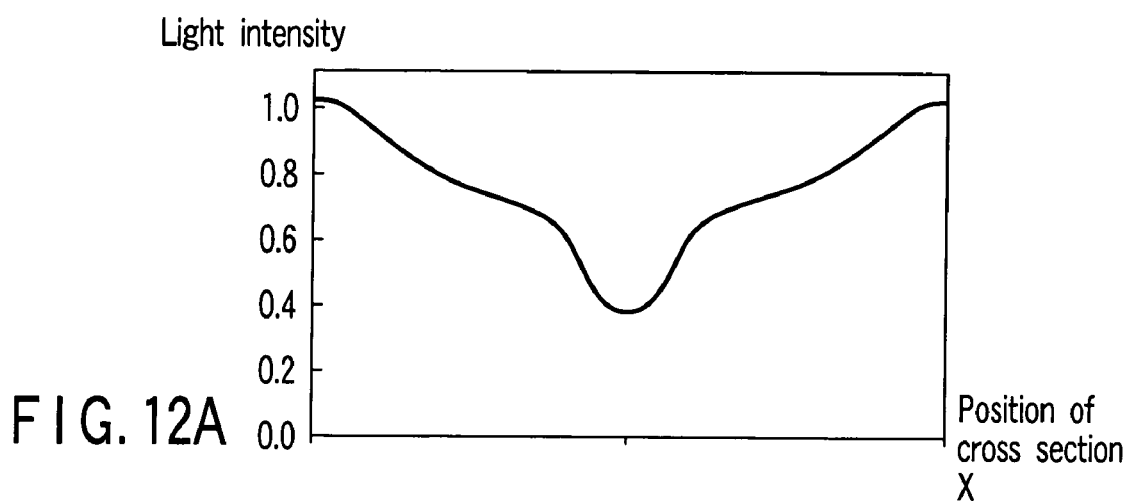
FIGS. 12A and 12B are second views schematically showing each V-shaped light intensity distribution formed through an image formation optical system when a binary modulation type light modulation element is used in a modification of the embodiment.
Figure 14:
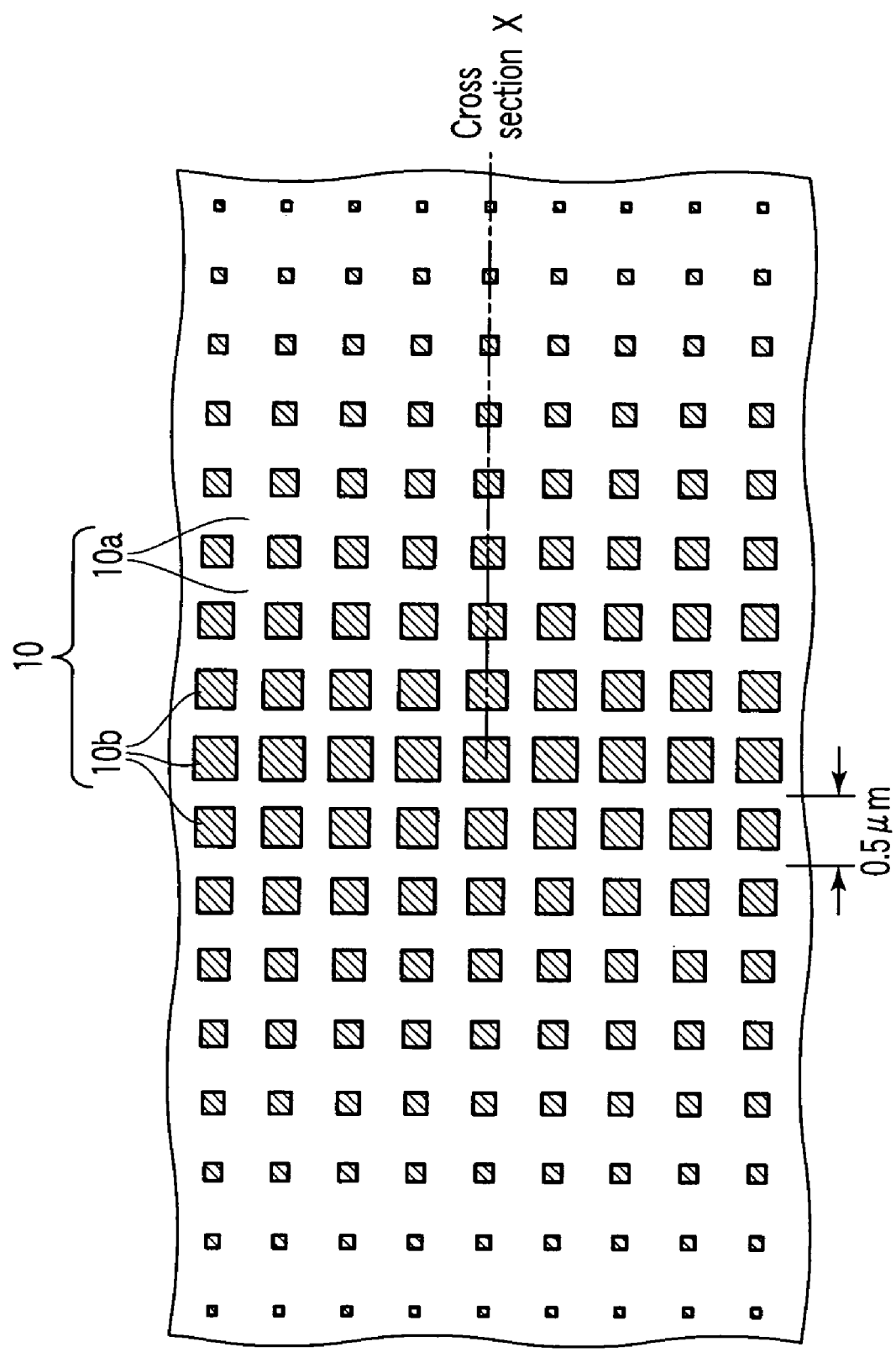
FIG. 14 is a view schematically showing a phase pattern of a binary modulation type light modulation element proposed in a related application.
Figure 15A:
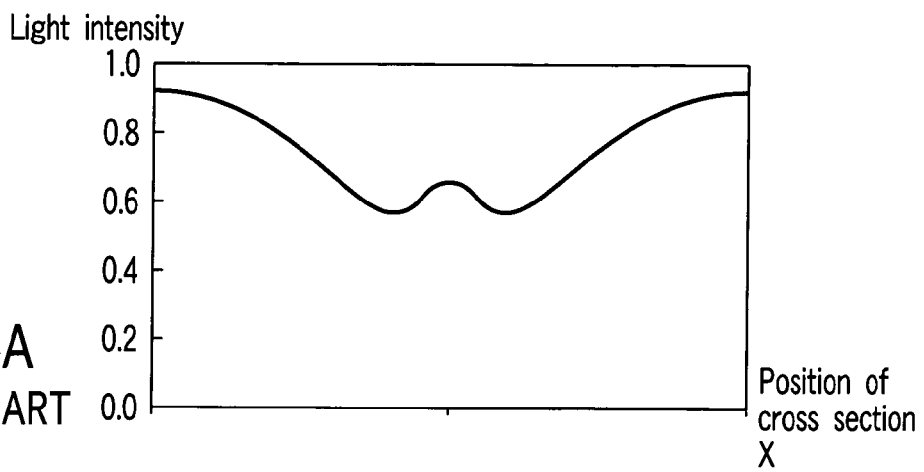
FIGS. 15A to 15C are views schematically showing each V-shaped light intensity distribution formed through an image formation optical system when the light modulation element of FIG. 14 is used.
Figure 15B:
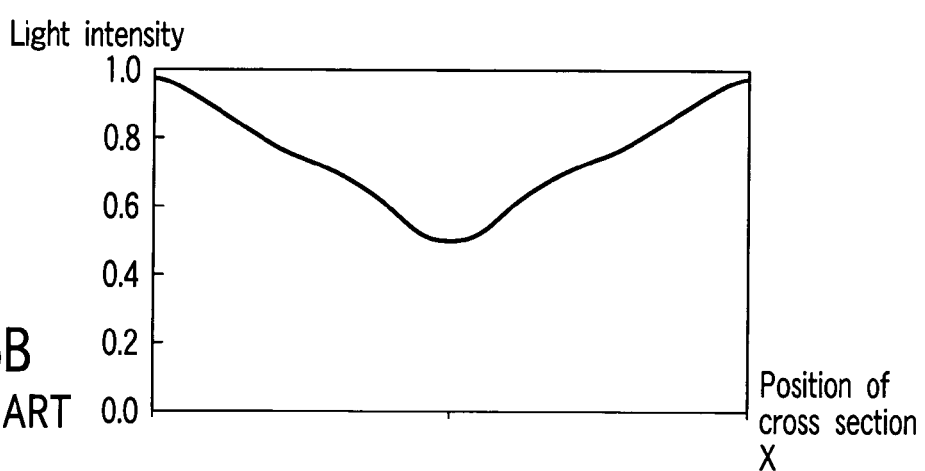
Figure 15C:
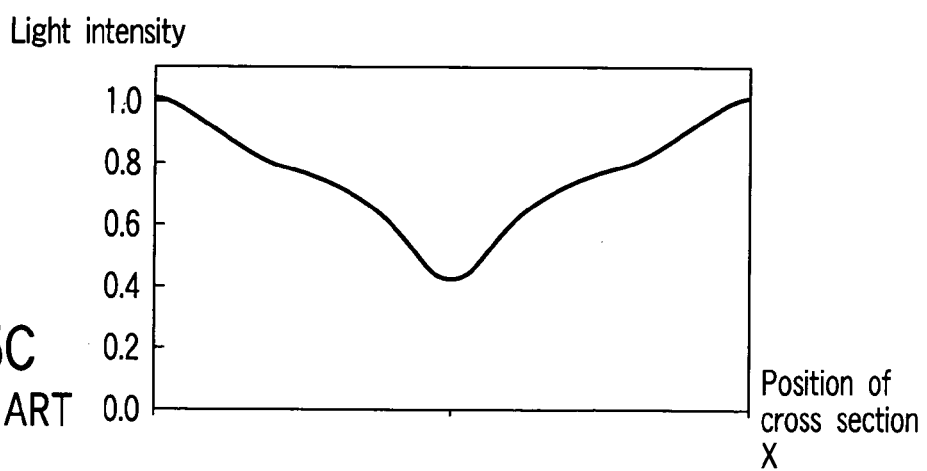

It is to be noted that the ternary modulation type light modulation element 1 based on the first technique according to the present invention is used in the foregoing embodiment, it is also possible to use a modification in which the defocus method as the second technique according to the present invention is applied while utilizing the binary modulation type light modulation element 10 shown in FIG. 14. FIGS. 11A to 11C and FIGS. 12A and 12B are views each schematically showing a V-shaped light intensity distribution formed through the image formation optical system when the binary modulation type light modulation element 10 is used. In this example, FIG. 11A corresponds to a defocus position of −5 μm; FIG. 11B, a focus position; FIG. 11C, a defocus position of +5 μm; FIG. 12A, a defocus position of +10 μm; and FIG. 12B, a defocus position of +15 μm.

Figure 12B:
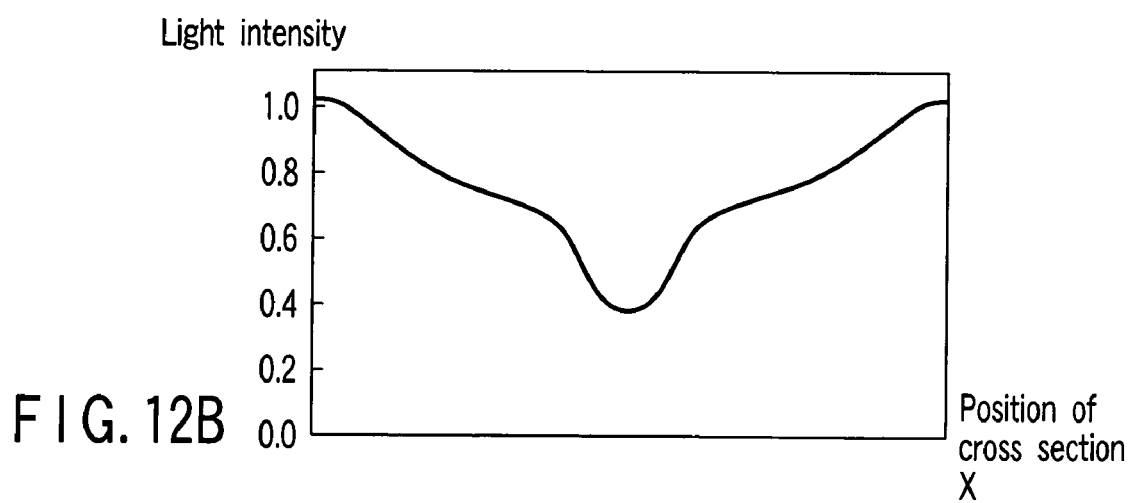

Referring to FIGS. 12A and 12B, it can be understood that a shape of the V-shaped light intensity distribution hardly changes between the defocus position of +10 μm and the defocus position of +15 μm. Therefore, in the modification of this embodiment, the binary modulation type light modulation element 10 shown in FIG. 14 is used, a defocus position of, e.g., +12.5 μm is assumed as a pseudo-focus position, and an irradiation target surface of the processed substrate 4 is set at this pseudo-focus position. As a result, even in the modification, a desired V-shaped light intensity distribution can be stably formed without being substantially affected by defocusing caused due to, e.g., a board thickness deviation unavoidably existing in the processed substrate 4, and hence crystal grains can be substantially evenly generated on a semiconductor film.

Figure 12C:
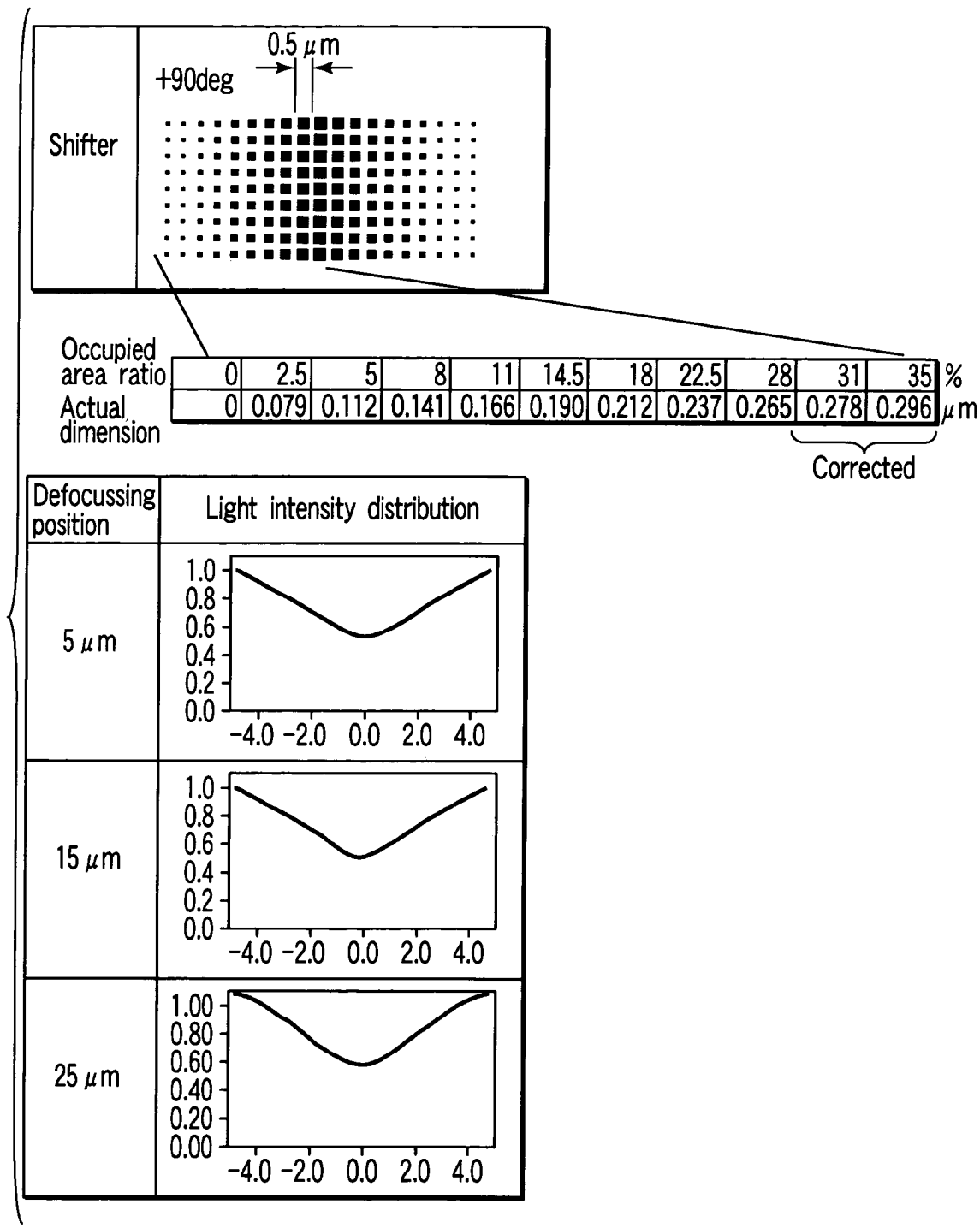
FIG. 12C is a view showing a corrected phase shifter according to a modification of the invention, and wave forms illustrating light intensity distributions obtained by using the corrected phase shifter.

In the defocusing process, it is possible to obtain ideal light intensity distributions at defocusing positions, as shown in FIG. 12C, by correcting an occupied area ration of the conventional phase shifter as shown in FIG. 14. In the exampled modified phase shifter, dimensions of the modulation-phase areas at the center of each unit of the phase shifter shown in FIG. 14 are changed to correct the occupied area ratios at the center. For example, in the conventional phase shifter, actual dimensions (conversion value on the projected plane of length of one side of the square modulation-phase area) of the largest and second largest modulation-phase areas are 0.354 μm and 0.335 μm to set the occupied area ratios to 50% and 40%, respectively, while in the corrected phase shifter, actual dimensions of the largest and second largest modulation-phase areas are 0.296 μm and 0.278 μm to set the occupied area ratios to 35% and 31%, respectively. This correction is only one example, and the occupied area ratio may be varied at the desired position of the phase shift to various values.

Figure 13A:
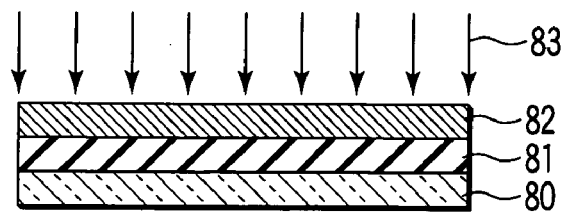
FIGS. 13A to 13E are process cross-sectional views showing processes of manufacturing an electronic device by using a crystallization apparatus according to the embodiment.

FIGS. 13A to 13E are process cross-sectional views showing processes for manufacturing an electronic device in an area crystallized by using the crystallization apparatus according to this embodiment. As shown in FIG. 13A, there is prepared a processed substrate 5 obtained by forming an underlying film 81 (e.g., a laminated film of SiN with a film thickness of 50 nm and $SiO_2$ with a film thickness of 100 nm) and an amorphous semiconductor film 82 (e.g., Si, Ge, SiGe or the like having a film thickness of approximately 50 nm to 200 nm) on an insulating substrate 80 (e.g., alkali glass, quartz glass, plastic, polyimide or the like) by a chemical vapor deposition method or a sputtering method. Further, a predetermined area on a surface of the amorphous silicon film 82 is irradiated with a laser light 83 (e.g., a KrF excimer laser light or an XeCl excimer laser light) by using the crystallization apparatus according to this embodiment.

Figure 13B:
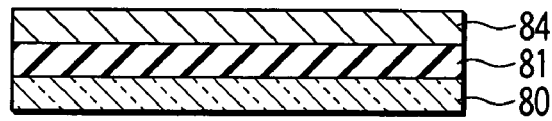
Figure 13C:
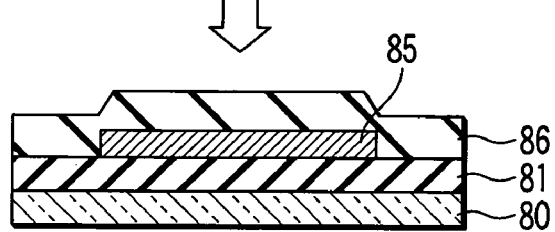
Figure 13D:
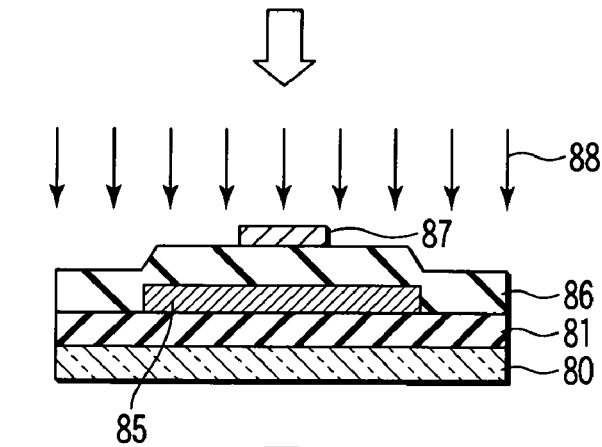
Figure 13E:
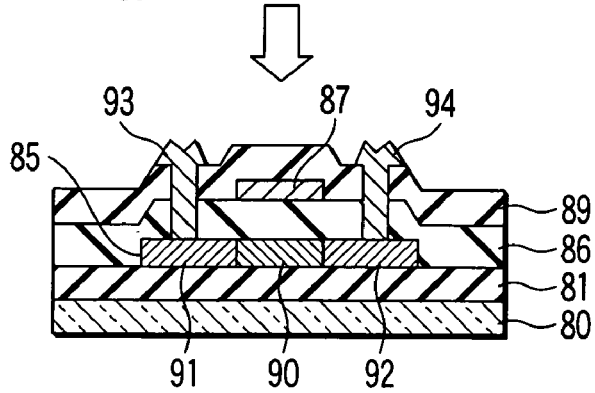

In this manner, as shown in FIG. 13B, a polycrystal semiconductor film or a single-crystallized semiconductor film 84 having a crystal with a large particle size is generated. Then, as shown in FIG. 13C, the polycrystal semiconductor film or the single-crystallized semiconductor film 84 is processed into an island-shaped semiconductor film 85 which becomes an area in which, e.g., a thin film transistor is formed by using a photolithography technique, and an $SiO_2$ film with a film thickness of 20 nm to 100 nm is formed as a gate insulating film 86 on a surface of the semiconductor film 85 by using the chemical vapor deposition method or the sputtering method. Furthermore, as shown in FIG. 13D, a gate electrode 87 (e.g., silicide or MoW) is formed on the gate insulating film, and impurity ions 88 (phosphor in case of an N channel transistor, and boron in case of a P channel transistor) are implanted with the gate electrode 87 being used as a mask. Thereafter, annealing processing (e.g., one hour at 450° C.) is performed in a nitrogen atmosphere, and impurities are activated so that a source area 91 and a drain area 92 are formed to the island-shaped semiconductor film 85. Subsequently, as shown in FIG. 13E, an interlayer insulating film 89 is formed and contact holes are formed in order to form a source electrode 93 and a drain electrode 94 which are connected with a source 91 and a drain 92 through a channel 90.

In the above-described processes, the channel 90 is formed in accordance with a position of a crystal with a large particle size of the polycrystal semiconductor film or the single-crystallized semiconductor film 84 generated in the processes shown in FIGS. 13A and 13B. With the above-described processes, a polycrystal transistor can be formed or a thin film transistor (TFT) can be formed to the single-crystallized semiconductor. The thus manufactured polycrystal transistor or single-crystallized transistor can be applied to a drive circuit for a liquid crystal display unit (a display) or an EL (electroluminescence) display or an integrated circuit such as a memory (an SRAM or a DRAM) or a CPU.

It is to be noted that the present invention is applied to the crystallization apparatus and the crystallization method which generate a crystallized semiconductor film by irradiating a polycrystal semiconductor film or an amorphous semiconductor film with a light having a predetermined light intensity distribution. However, the present invention is not restricted thereto, and it can be generally applied to a light irradiation apparatus which forms a predetermined light intensity distribution on a predetermined surface through the image formation optical system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A light irradiation apparatus comprising:
   a light modulation element which modulates a phase of an incident light beam to obtain a V-shaped light intensity distribution having a bottom portion of a minimum light intensity; and
   an image formation optical system which applies the modulated light beam from the light modulation element to an irradiation target surface in such a manner that the V-shaped light intensity distribution is provided on the irradiation target surface,
   wherein the light modulation element has such a complex amplitude transmittance distribution that a secondary derivative of a phase value of a complex amplitude distribution becomes substantially zero at the bottom portion of the V-shaped light intensity distribution in an image space of the image formation optical system.

2. The light irradiation apparatus according to claim 1, wherein the following conditions are satisfied:

$$(\delta^2/\delta x^2)\arg(\int T(X,Y)dXdY) \approx 0$$

$$(\delta^2/\delta y^2)\arg(\int T(X,Y)dXdY) \approx 0$$

wherein (X,Y) is an in-plane coordinate of the light modulation element, T(X,Y) is a complex amplitude transmittance distribution of the light modulation element, (x,y) is an in-plane coordinate of an image surface of the image formation optical system, $\int$ is an integration symbol in a point spread function range of the image formation optical system where a point on the light modulation element corresponding to a point (x,y) on the image surface is the center, and arg is a function which is used to obtain a phase value.

3. The light irradiation apparatus according to claim 1, wherein the complex amplitude transmittance distribution of the light modulation element has a phase modulation unit whose dimension is not greater than the point spread function range of the image formation optical system.

4. The light irradiation apparatus according to claim 1, wherein the light modulation element has at least three types of phase areas having fixed phase values different from each other, and occupied area ratios of the phase areas vary in accordance with a predetermined pattern.

5. The light irradiation apparatus according to claim 1, wherein the light modulation element comprises, as at least three types of phase areas, a reference phase area having a reference phase value of 0 degree as a reference, a first phase-modulation area having a first modulation phase value which is a phase-modulation having a positive value, and a second phase-modulation area having a second modulation phase value which is a phase-modulation having a negative value whose absolute value is substantially equal to that of the first modulation phase value.

6. The light irradiation apparatus according to claim 5, wherein a pattern with which an occupied area ratio of the first phase-modulation area with respect to the reference phase area varies is substantially equal to a pattern with which an occupied area ratio of the second phase-modulation area with respect to the reference phase area varies.

7. A light irradiation method having a light modulation element which modulates an incident light beam, and an image formation optical system which applies a light beam with a V-shaped light intensity distribution having a bottom portion of a minimum light intensity to an irradiation target surface,
   wherein the irradiation target surface is positioned at such a position that a secondary derivative of a phase value of a complex amplitude distribution becomes substantially zero at the bottom portion of the V-shaped light intensity distribution in an image space of the image formation optical system, and the irradiation target surface is irradiated with a light.

8. A crystallization apparatus comprising: the light irradiation apparatus defined in claim 1; and a stage which holds a processed substrate including a non-single-crystal semiconductor film having the irradiation target surface on an image formation surface of the image formation optical system.

9. A crystallization method which applies a light having the V-shaped light intensity distribution to the processed substrate having a non-single-crystal semiconductor film set as the irradiation target surface to generate a crystallized semiconductor film by using the light irradiation apparatus defined in claim 1.

10. A device manufactured by using the crystallization method defined in claim 9.

* * * * *